US012563878B2

(12) United States Patent
Lee et al.

(10) Patent No.: US 12,563,878 B2
(45) Date of Patent: Feb. 24, 2026

(54) DISPLAY DEVICE

(71) Applicant: Samsung Display Co., LTD., Yongin-si (KR)

(72) Inventors: Yong Hee Lee, Suwon-si (KR); Jin Seon Kwak, Hwaseong-si (KR); Kyung Bae Kim, Seongnam-si (KR); Ji Hye Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 955 days.

(21) Appl. No.: 17/559,530

(22) Filed: Dec. 22, 2021

(65) Prior Publication Data

US 2022/0302203 A1 Sep. 22, 2022

(30) Foreign Application Priority Data

Mar. 19, 2021 (KR) ........................ 10-2021-0035911

(51) Int. Cl.
*G09G 3/36* (2006.01)
*H10H 29/14* (2025.01)

(52) U.S. Cl.
CPC ................................. *H10H 29/142* (2025.01)

(58) Field of Classification Search
None
See application file for complete search history.

(56) References Cited

U.S. PATENT DOCUMENTS

| 6,590,553 B1 * | 7/2003 | Kimura ................ G09G 3/3651 |
| | | 345/98 |
| 9,893,139 B2 | 2/2018 | Kim et al. |
| 10,607,943 B2 | 3/2020 | Kim et al. |
| 2006/0044241 A1 * | 3/2006 | Yuh-Ren .............. G09G 3/3648 |
| | | 345/89 |
| 2017/0205955 A1 * | 7/2017 | Yang ................... G06F 3/04184 |
| 2022/0157919 A1 * | 5/2022 | Tian ................... H10K 59/1213 |

FOREIGN PATENT DOCUMENTS

| KR | 2013-0116544 A | 10/2013 |
| KR | 2017-0114027 A | 10/2017 |
| KR | 2019-0066646 A | 6/2019 |
| KR | 2020-0039272 A | 4/2020 |
| KR | 2020-0088951 A | 7/2020 |

* cited by examiner

*Primary Examiner* — Carl Adams
(74) *Attorney, Agent, or Firm* — Womble Bond Dickinson (US) LLP

(57) ABSTRACT

A display device includes a substrate including a display area and a non-display area, a first voltage pattern and a second voltage pattern arranged along a first side of the non-display area, the first voltage pattern and the second voltage pattern being alternately located, a first sub-voltage pattern and a second sub-voltage pattern arranged along a second side opposite the first side of the non-display area, the first sub-voltage pattern and the second sub-voltage pattern being and alternately located, a first voltage extension wire extending along a third side crossing the first side of the non-display area and connected to the first voltage pattern, and a second voltage extension wire extending along a fourth side opposite the third side of the non-display area and connected to the second voltage pattern.

20 Claims, 16 Drawing Sheets

10

NDA

DPA

DR2

DR1

DR3

WPD_VDD

WPD_Vint   WPD_VSS

WPD_DT   VDL

VIL     VSL

WPD_CW    DTL    PDA

CWL

SDR

SSL

SCL

DR2

DR3 → DR1

WPD { WPD_DT
WPD_VDD
WPD_VSS
WPD_Vint
WPD_CW

DR3

DR1

DR2

T1: ACT, G1, SE, DE

FIG. 6

T1 : ACT,G1,SE,DE

DISPLAY DEVICE

CROSS-REFERENCE TO RELATED APPLICATION

This application claims priority to and the benefit of Korean Patent Application No. 10-2021-0035911 filed on Mar. 19, 2021 in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

SUMMARY

Aspects and features of embodiments of the present disclosure provide a display device capable of reducing or minimizing static electricity or noise signals that may be applied from the outside.

However, aspects and features of embodiments of the present disclosure are not restricted to the one set forth herein. The above and other aspects and features of embodiments of the present disclosure will become more apparent to one of ordinary skill in the art to which the present disclosure pertains by referencing the detailed description of the present disclosure given below.

According to one or more embodiments, in a display device, by disposing each of patterns and wires to which a DC voltage is applied in a non-display area around (e.g., surrounding) a display area, it is possible to block or reduce static electricity or noise signals that may be applied from the outside.

In addition, according to one or more embodiments, in a display device, it is possible to prevent a seam from being generated in the insulating layers due to a height difference between the wires, thereby preventing the occurrence of a short circuit or burning between the wires.

However, effects, aspects, and features of embodiments of the present disclosure are not limited to the aforementioned effects, aspects, and features and various other effects aspects, and features are included in the present disclosure.

According to one or more embodiments of the present disclosure, a display device includes a substrate including a display area and a non-display area, a first voltage pattern and a second voltage pattern arranged along a first side of the non-display area, the first voltage pattern and the second voltage pattern being alternately located, a first sub-voltage pattern and a second sub-voltage pattern arranged along a second side opposite the first side of the non-display area, the first sub-voltage pattern and the second sub-voltage pattern being and alternately located, a first voltage extension wire extending along a third side crossing the first side of the non-display area and connected to the first voltage pattern, and a second voltage extension wire extending along a fourth side opposite the third side of the non-display area and connected to the second voltage pattern.

In one or more embodiments, the first voltage pattern opposes the first sub-voltage pattern with the display area interposed therebetween, and the second voltage pattern opposes the second sub-voltage pattern with the display area interposed therebetween.

In one or more embodiments, the first voltage extension wire extends from the first voltage pattern and is connected to the first sub-voltage pattern, and the second voltage extension wire extends from the second voltage pattern and is connected to the second sub-voltage pattern.

In one or more embodiments, the first voltage extension wire extends to the first side and the second side, and the second voltage extension wire extends to the first side and the second side.

In one or more embodiments, the first voltage extension wire is formed integrally with the first voltage pattern and the first sub-voltage pattern, the second voltage extension wire is formed integrally with the second voltage pattern and the second sub-voltage pattern, and the first voltage extension wire and the second voltage extension wire include a same material.

In one or more embodiments, the first voltage extension wire extends from the first voltage pattern and is spaced from the first sub-voltage pattern, and the second voltage extension wire extends from the second voltage pattern and is spaced from the second sub-voltage pattern.

In one or more embodiments, the first voltage extension wire extends to the first side and is spaced from the second side, and the second voltage extension wire extends to the first side and is spaced from the second side.

In one or more embodiments, the first voltage extension wire is formed integrally with the first voltage pattern, the second voltage extension wire is formed integrally with the second voltage pattern, and the first voltage extension wire and the second voltage extension wire include a same material.

In one or more embodiments, the display device further includes one or more alignment keys located between the first sub-voltage pattern and the first voltage extension wire and between the second sub-voltage pattern and the second voltage extension wire, respectively.

In one or more embodiments, the first voltage pattern is located at one end of the first side, the first sub-voltage pattern is located at one end of the second side, the second voltage pattern is located at an other end of the first side, and the second sub-voltage pattern is located at an other end of the second side.

In one or more embodiments, the display device further includes a first voltage wire extending from the first voltage pattern and passing through the display area to be connected to the first sub-voltage pattern, and a second voltage wire extending from the second voltage pattern and passing through the display area to be connected to the second sub-voltage pattern.

According to one or more embodiments of the present disclosure, a display device includes a substrate including a display area and a non-display area, a first voltage pattern and a second voltage pattern arranged along a first side of the non-display area, the first voltage pattern and the second voltage pattern being alternately located, a first sub-voltage pattern and a second sub-voltage pattern arranged along a second side opposite the first side of the non-display area, the first sub-voltage pattern and the second sub-voltage pattern being alternately located, a plurality of first division patterns arranged along a third side crossing the first side of the non-display area and spaced from the first voltage pattern, and a plurality of second division patterns arranged along a fourth side opposite the third side of the non-display area and spaced from the second voltage pattern.

In one or more embodiments, each of the plurality of first division patterns and the plurality of second division patterns is an island-shaped pattern.

In one or more embodiments, the display device further includes a first voltage wire extending from the first voltage pattern and passing through the display area to be connected to the first sub-voltage pattern, and a second voltage wire extending from the second voltage pattern and passing through the display area and be connected to the second sub-voltage pattern.

In one or more embodiments, the display device further includes a first voltage auxiliary wire passing through the display area to be connected to the first voltage wire, and a second voltage auxiliary wire passing through the display area to be connected to the second voltage wire, wherein the plurality of first division patterns are connected to the first voltage auxiliary wire, and the plurality of second division patterns are connected to the second voltage auxiliary wire.

According to one or more embodiments of the present disclosure, a display device includes a substrate including a display area and a non-display area, a first voltage pattern and a second voltage pattern arranged along a first side of the non-display area, the first voltage pattern and the second voltage pattern being alternately located, a first sub-voltage pattern and a second sub-voltage pattern arranged along a second side opposite the first side of the non-display area, the first sub-voltage pattern and the second sub-voltage pattern being alternately located, a first voltage wire extending from the first voltage pattern and passing through the display area to be connected to the first sub-voltage pattern, a second voltage wire extending from the second voltage pattern and passing through the display area to be connected to the second sub-voltage pattern, and a plurality of voltage extension wires extending along at least two sides crossing the first side of the non-display area and connected to the first voltage pattern or the second voltage pattern.

In one or more embodiments, the first voltage pattern is located at each of one end and an other end of the first side, and the first sub-voltage pattern is at each of one end and an other end of the second side.

In one or more embodiments, the plurality of voltage extension wires is first voltage extension wires extending along a third side and a fourth side crossing the first side and connected to the first voltage pattern or the first voltage pattern and the first sub-voltage pattern.

In one or more embodiments, the second voltage pattern is located at each of one end and an other end of the first side, and the second sub-voltage pattern is located at each of one end and an other end of the second side.

In one or more embodiments, the plurality of voltage extension wires is second voltage extension wires extending along a third side and a fourth side crossing the first side and connected to the second voltage pattern or the second voltage pattern and the second sub-voltage pattern.

BRIEF DESCRIPTION OF THE DRAWINGS

The above and other aspects and features of embodiments of the present disclosure will become more apparent by

Figure 1:
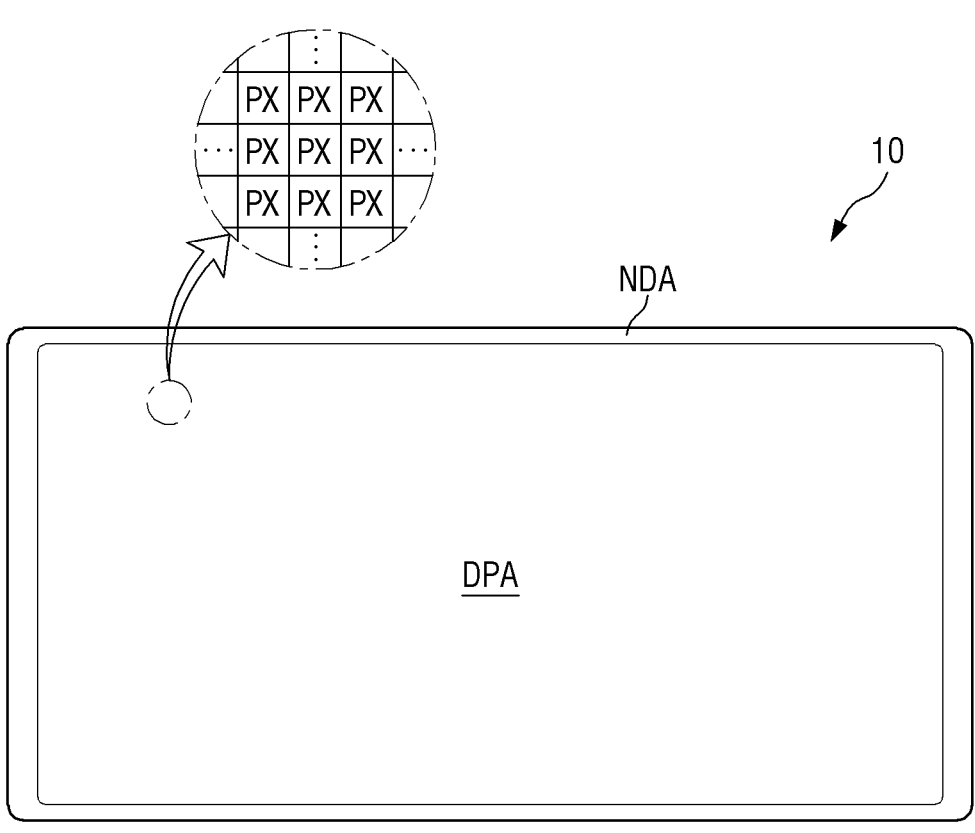
Figure 1:
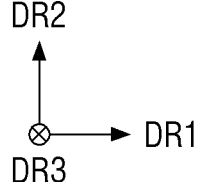
Figure 2:
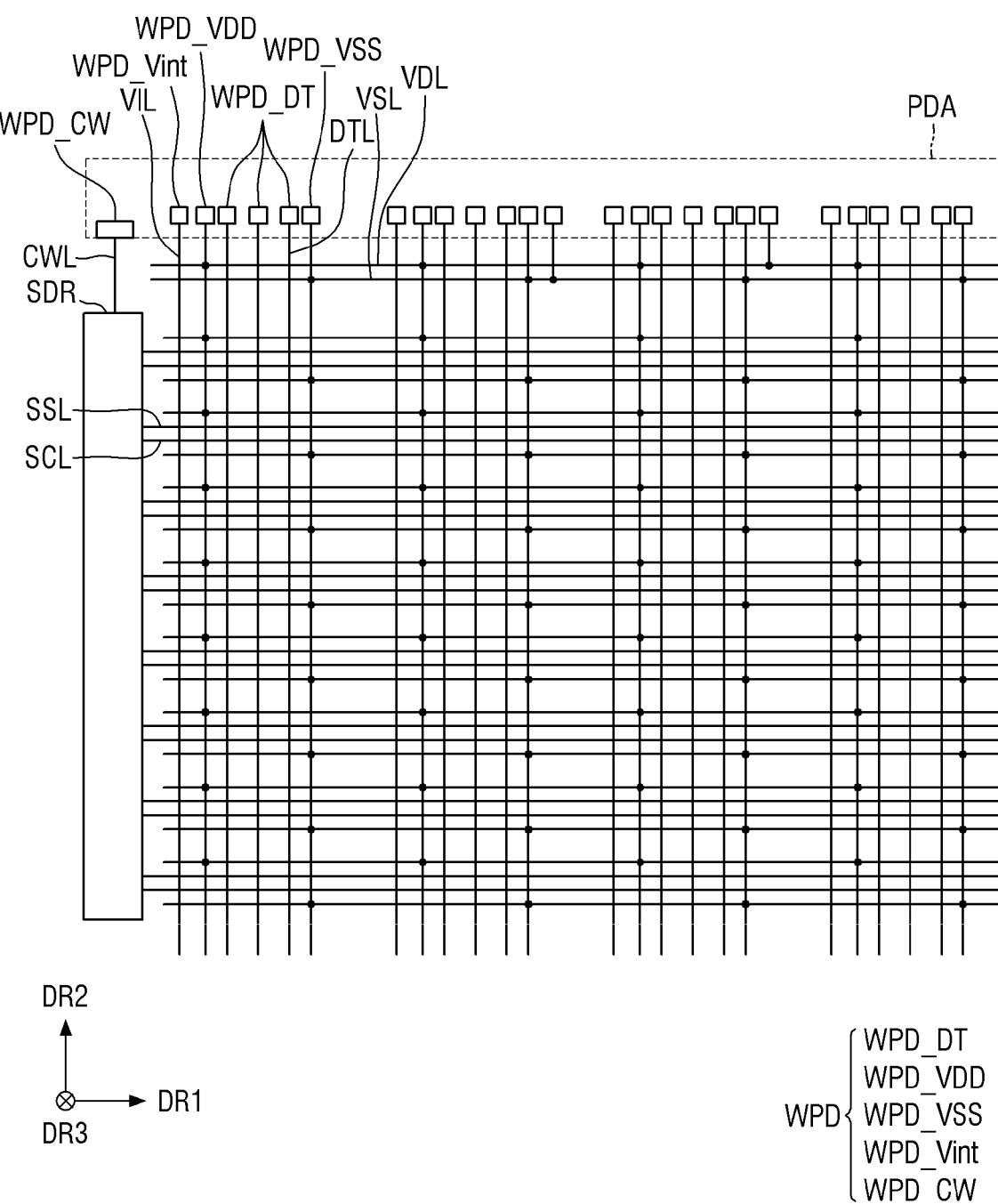
Figure 3:
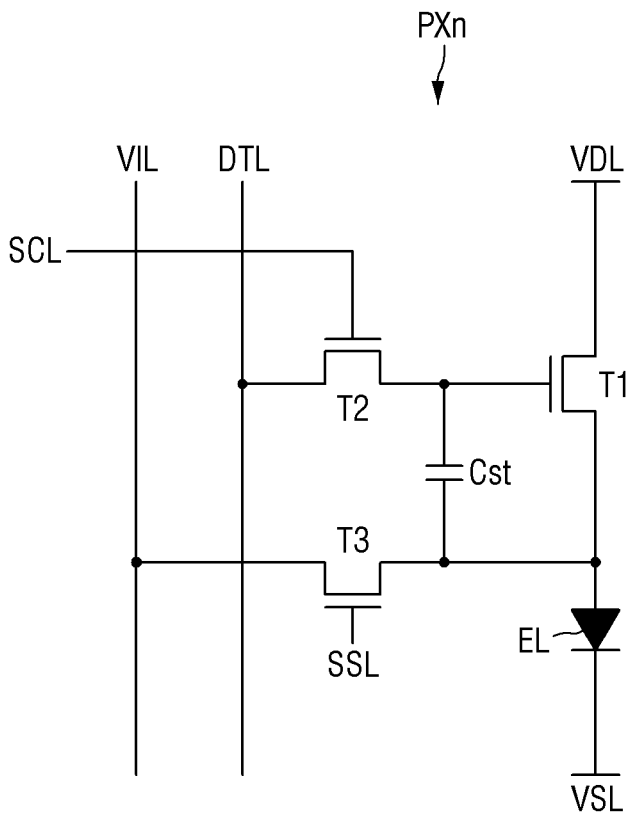
Figure 4:
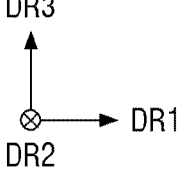
Figure 5:
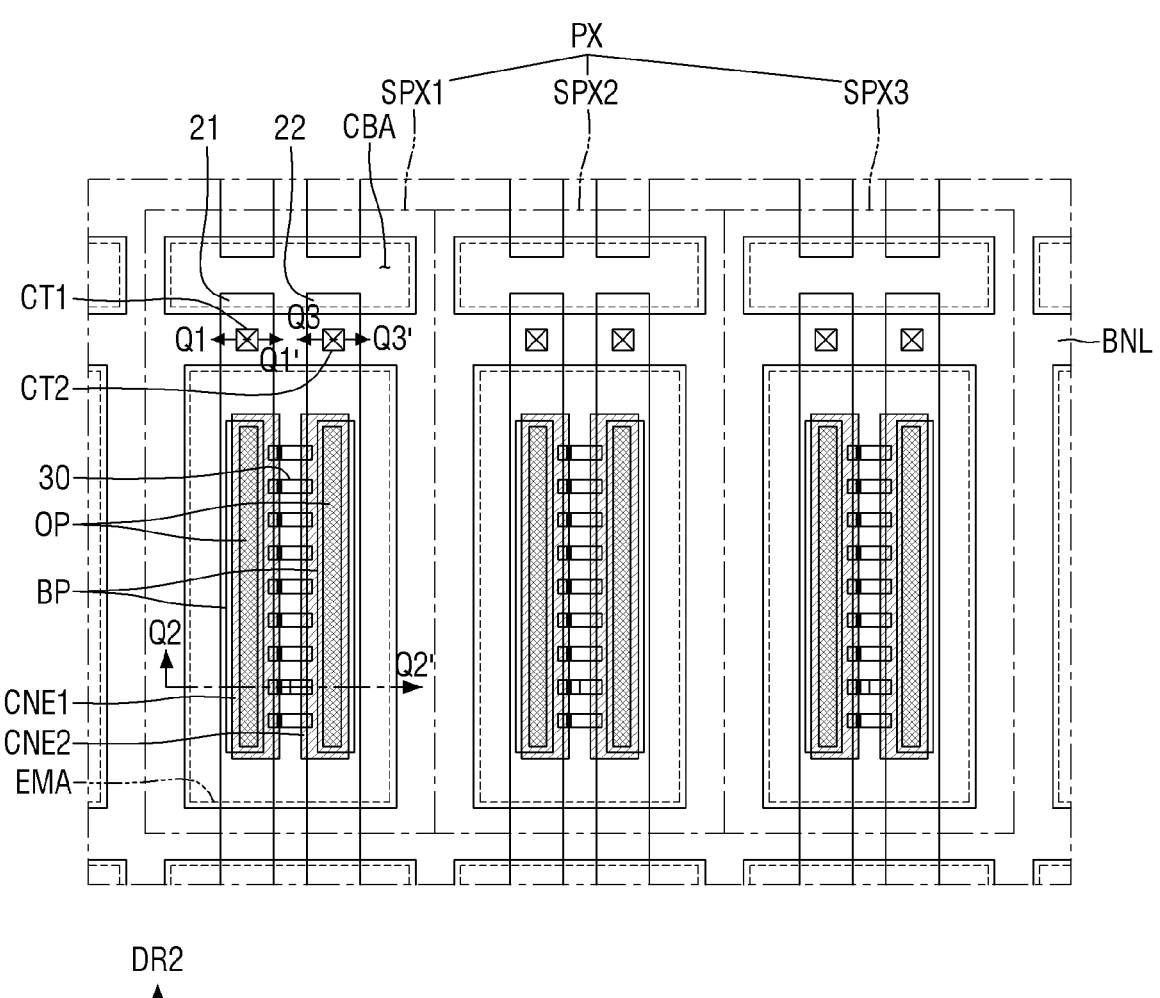
Figure 5:
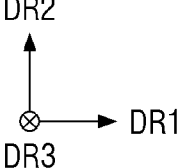
Figure 7:
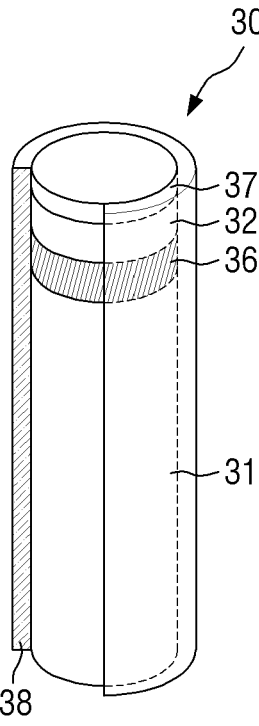
Figure 8:
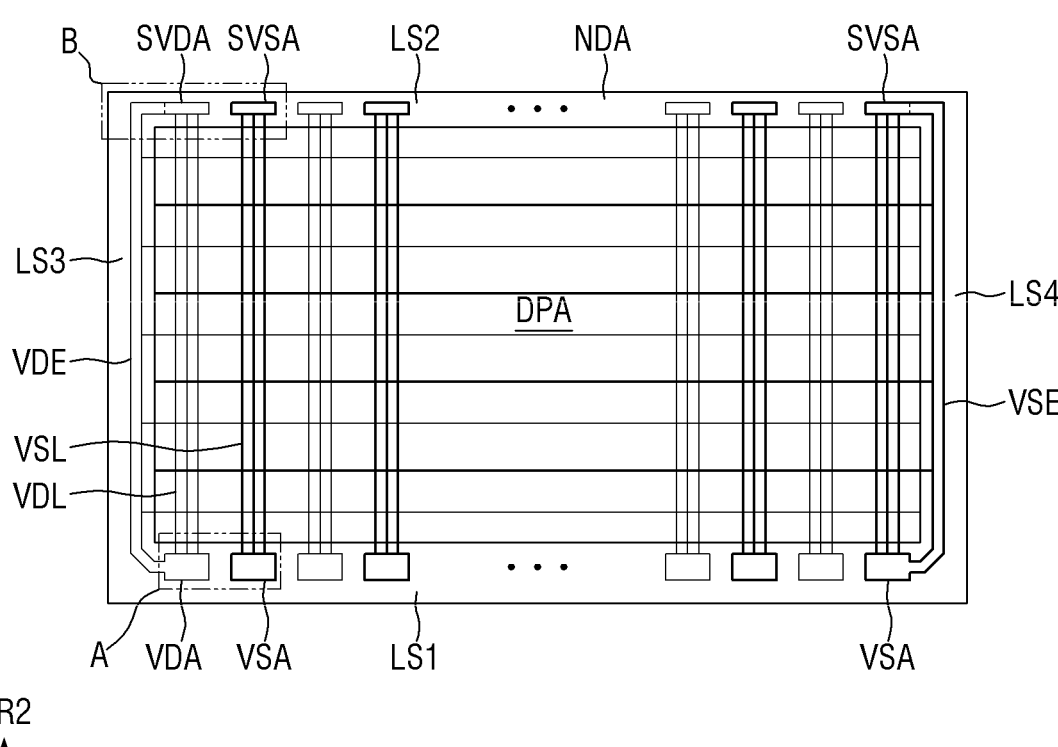
Figure 8:
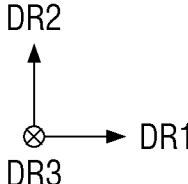
Figure 9:
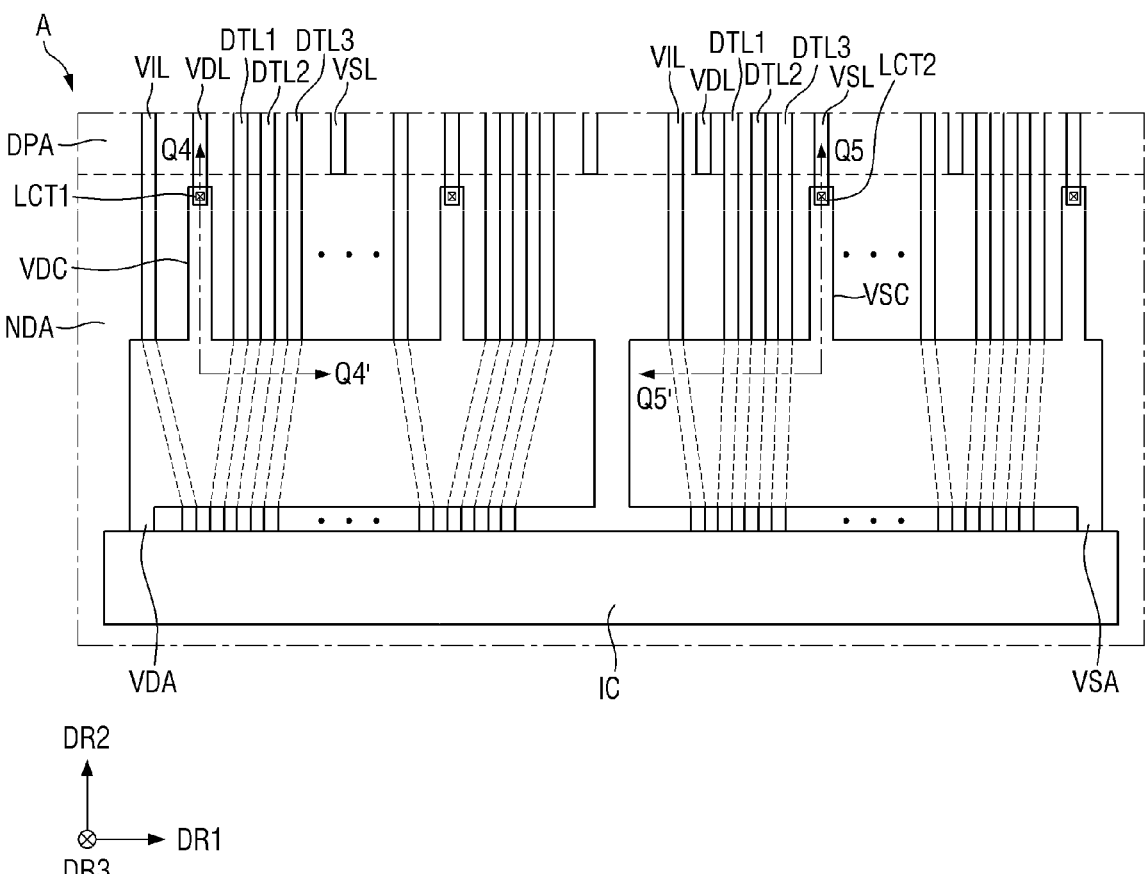
Figure 10:
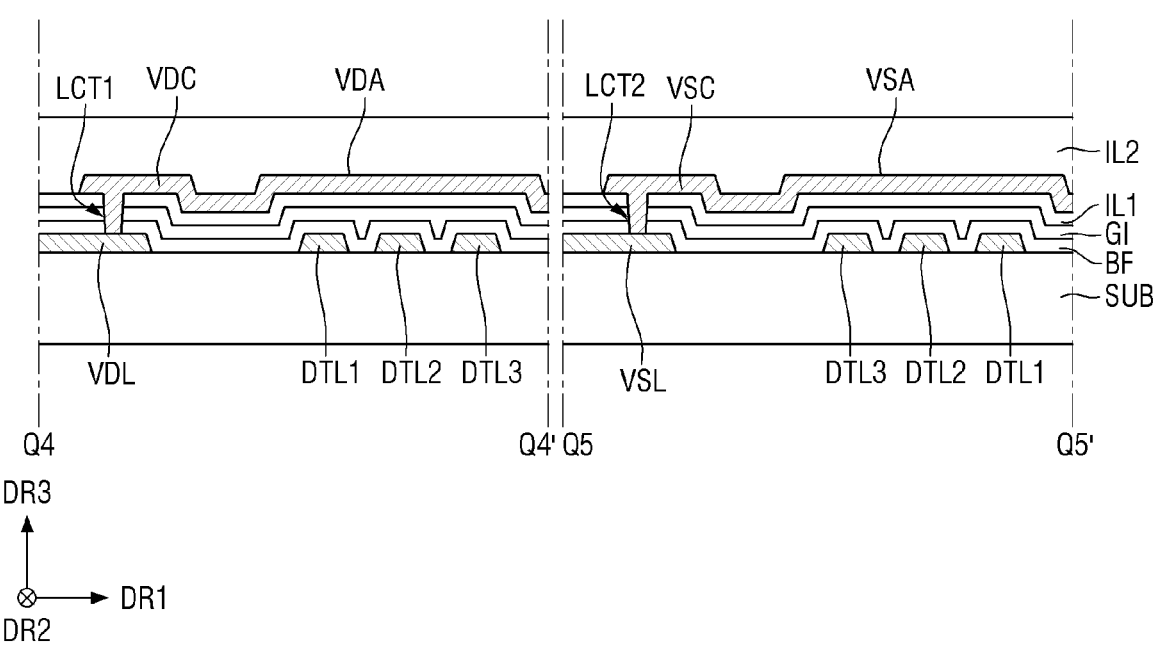
Figure 11:
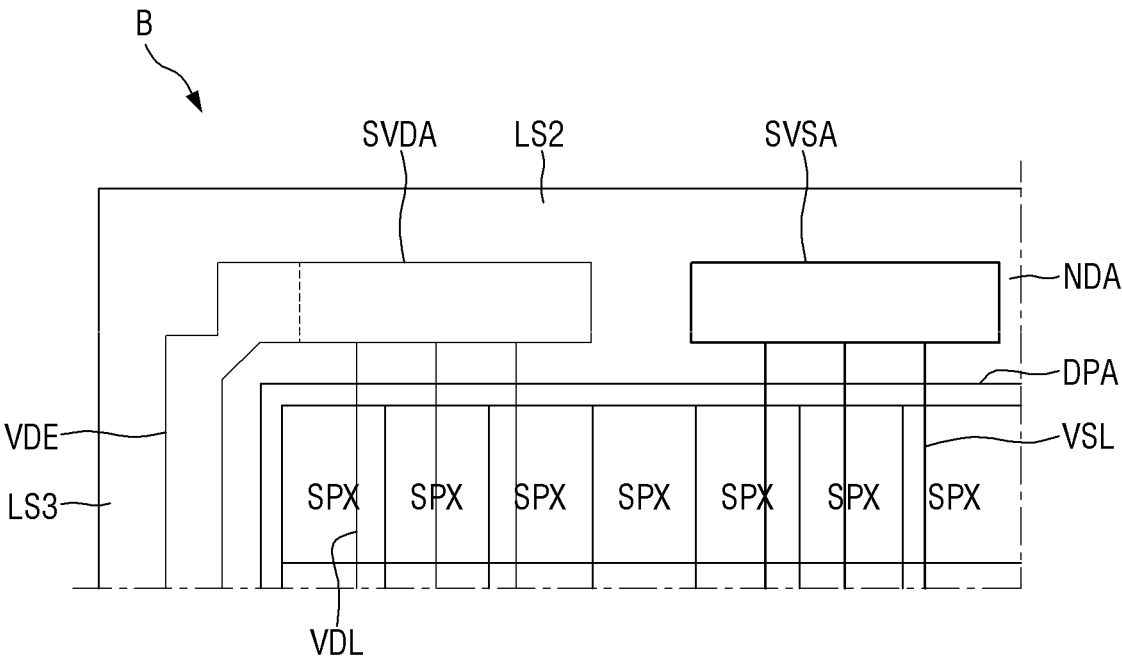
Figure 12:
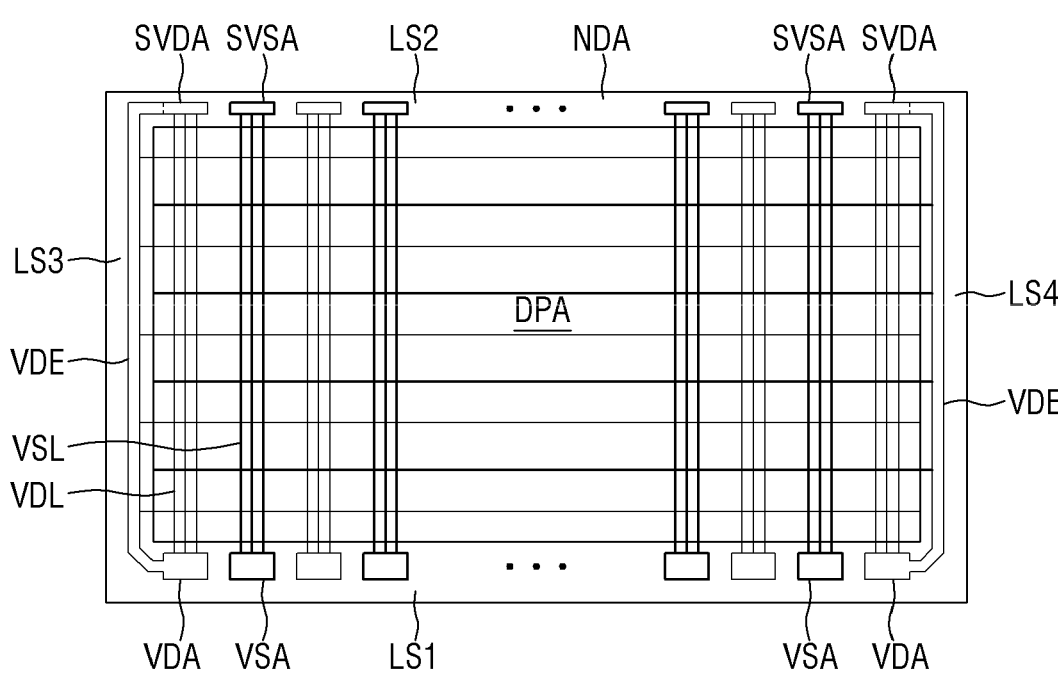
Figure 12:
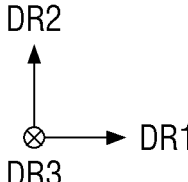
Figure 13:
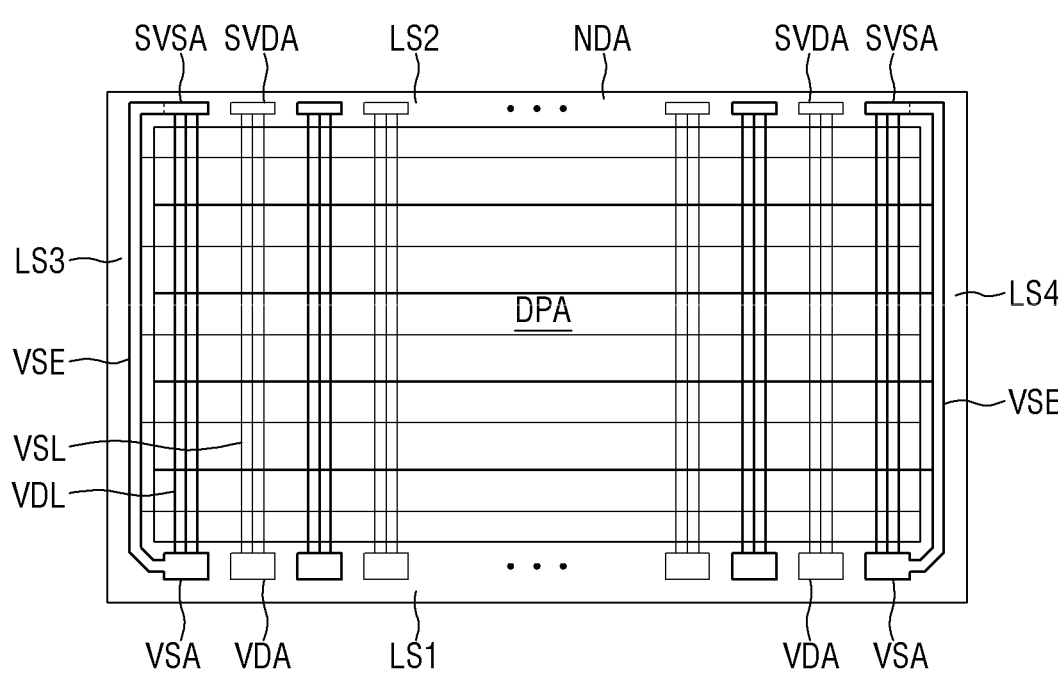
Figure 13:
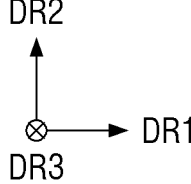
Figure 14:
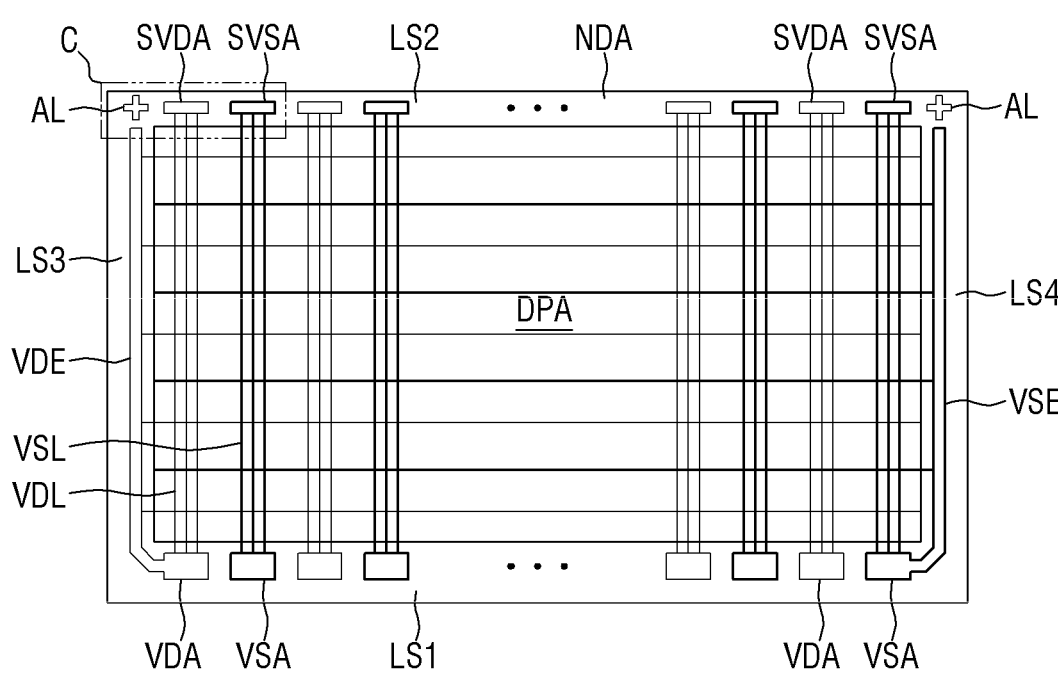
Figure 14:
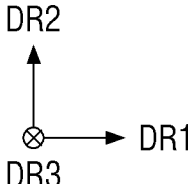
Figure 15:
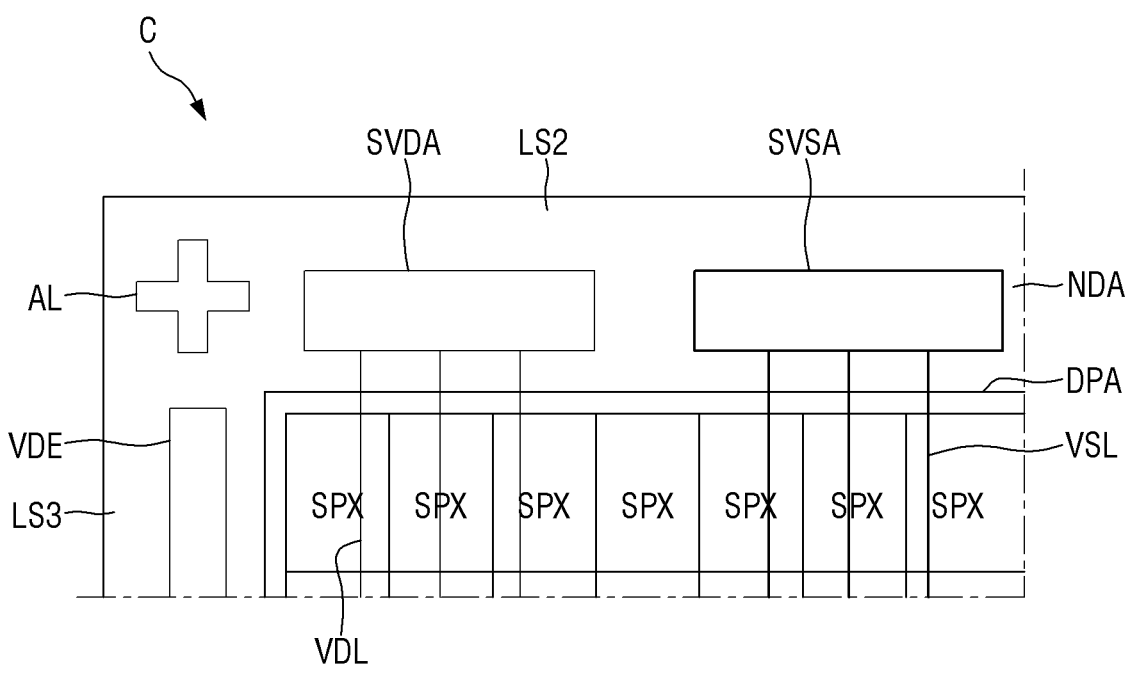

4 describing in detail embodiments thereof with reference to the attached drawings, in which:

FIG. 1 is a schematic plan view of a display device according to one or more embodiments;

FIG. 2 is a schematic layout diagram showing wires included in a display device according to one or more embodiments;

FIG. 3 is an equivalent circuit diagram of a sub-pixel according to one or more embodiments;

FIG. 4 is a cross-sectional view schematically illustrating one pixel of a display device according to one or more embodiments;

FIG. 5 is a plan view illustrating one pixel of a display device according to one or more embodiments;

Figure 6:
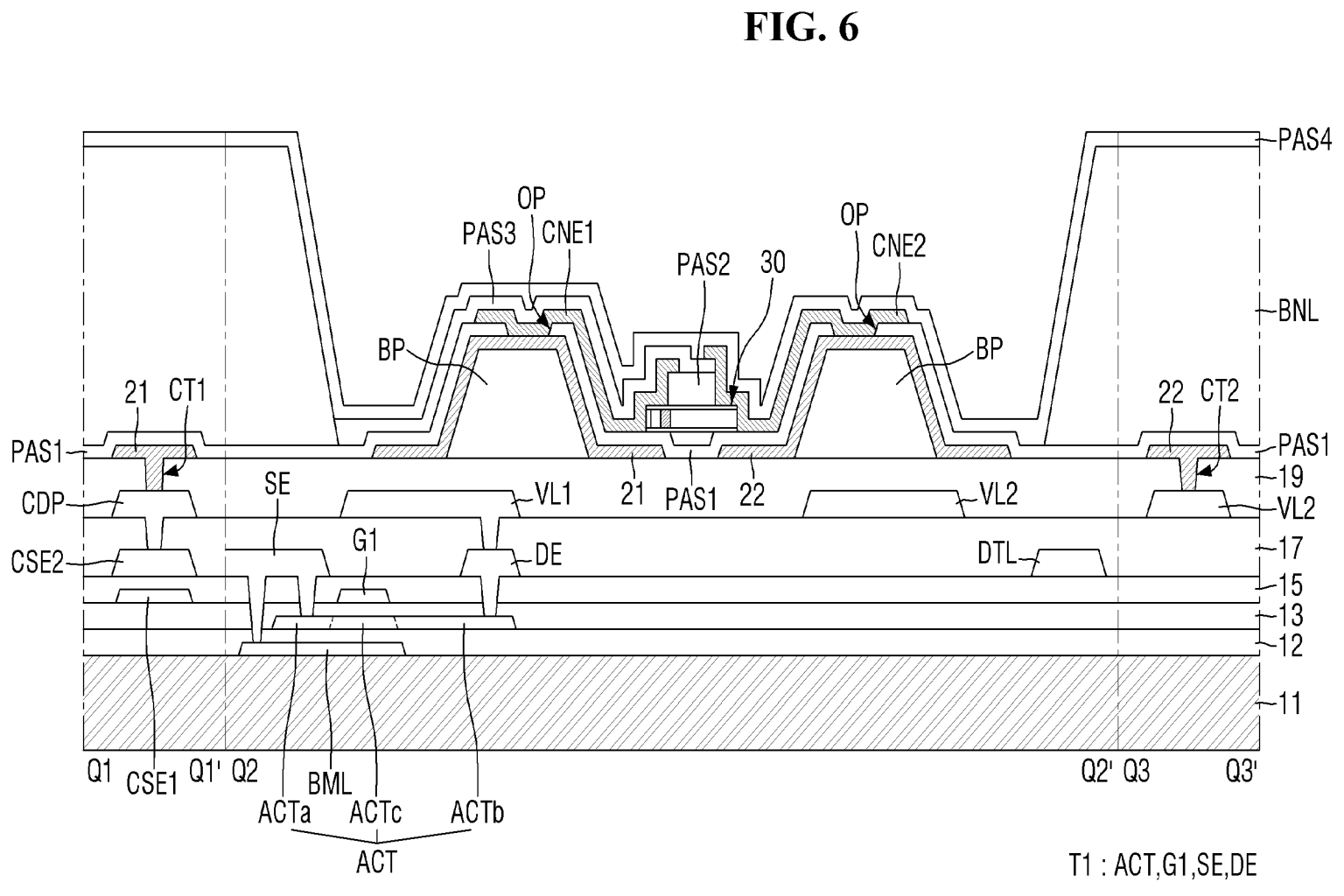

FIG. 6 is a cross-sectional view taken along the lines Q1-Q1', Q2-Q2', and Q3-Q3' of FIG. 5;

FIG. 7 is a perspective view of a light emitting element according to one embodiment;

FIG. 8 is a plan view schematically illustrating a display device according to one or more embodiments;

FIG. 9 is a plan view schematically showing an area A of FIG. 8;

FIG. 10 is a cross-sectional view taken along the lines Q4-Q4' and Q5-Q5' of FIG. 9;

FIG. 11 is a plan view schematically showing an area B of FIG. 8;

FIG. 12 is a plan view schematically illustrating a display device according to one or more embodiments;

FIG. 13 is a plan view schematically illustrating a display device according to one or more embodiments;

FIG. 14 is a plan view schematically illustrating a display device according to one or more embodiments;

FIG. 15 is a plan view schematically showing an area C of FIG. 14; and

Figure 16:
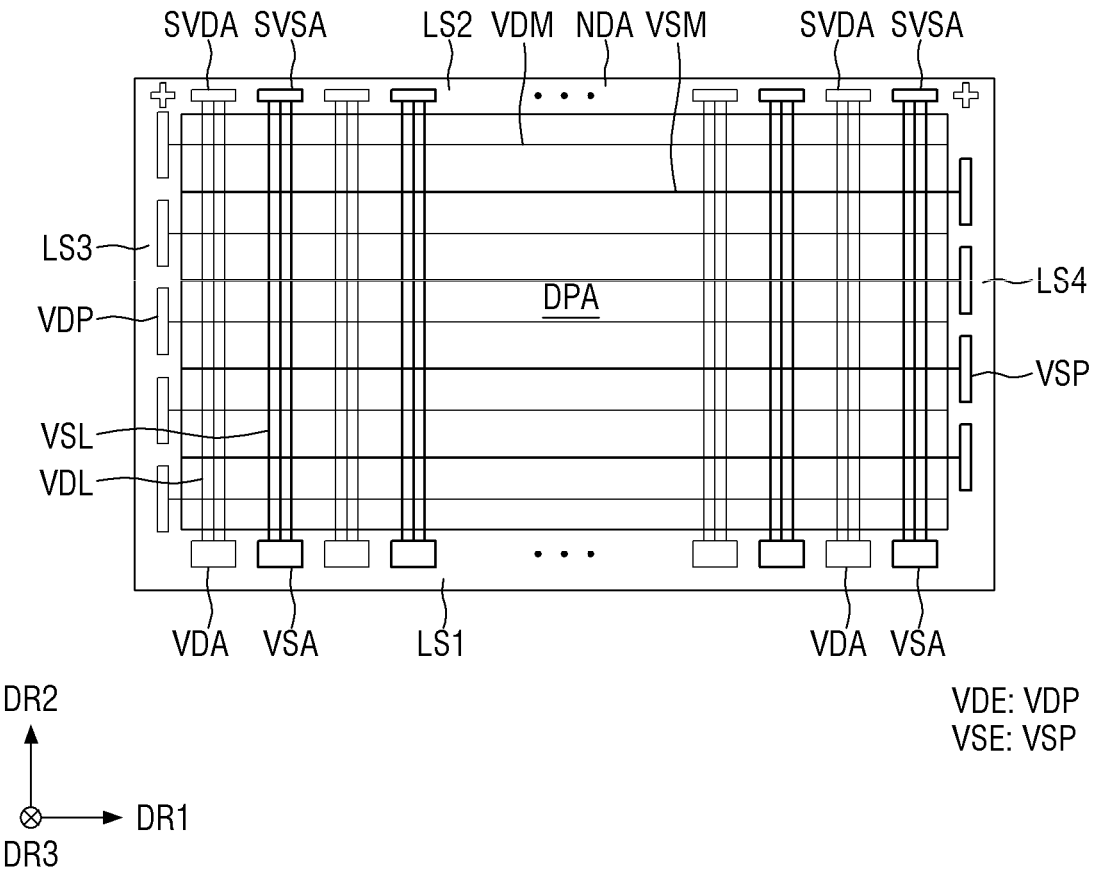

FIG. 16 is a plan view schematically illustrating a display device according to one or more embodiments.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to one or more embodiments set forth herein. Rather, these embodiments are provided so that this disclosure will be thorough and complete, and will fully convey the scope of the present to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, one or more embodiments will be described in detail with reference to the accompanying drawings.

FIG. 1 is a schematic plan view of a display device according to one or more embodiments.

The terms "above," "top" and "top surface" as used herein refer to an upward direction (i.e., one side of a third direction DR3) with respect to a display device 10. The terms "below," "bottom" and "bottom surface" as used herein refer to the other side of the third direction DR3. Further, "left", "right", "upper" and "lower" indicate directions when the display device 10 is viewed from above. For example, "left" indicates one side of a first direction DR1, "right" indicates the other side of the first direction DR1, "upper" indicates one side of a second direction DR2, and "lower" indicates the other side of the second direction DR2.

Referring to FIG. 1, the display device 10 may display a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel that provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the present disclosure is not limited thereto, and other display panels may be applied within the same scope of the technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA around (or surrounding) an edge or periphery of the display area DPA. The display area DPA is an area where an image can be displayed, and the non-display area NDA is an area where an image is not displayed. The display area DPA may also be referred to as an active region, and the non-display area NDA may also be referred to as a non-active region. The display area DPA may substantially occupy the center (or the central region) of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be alternately disposed in a stripe or a PENTILE™ arrangement structure, but the present disclosure is not limited thereto. This PEN-TILE® arrangement structure may be referred to as an RGBG matrix structure (e.g., a PENTILE® matrix structure or an RGBG structure (e.g., a PENTILE® structure)). PEN-TILE® is a registered trademark of Samsung Display Co., Ltd., Republic of Korea. In addition, each of the pixels PX may include one or more light emitting elements ED that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

FIG. 2 is a schematic layout diagram showing wires included in a display device according to one or more embodiments.

Referring to FIG. 2, the display device 10 may include a plurality of wires. The plurality of wires may include a scan line SCL, a sensing line SSL, a data wire DTL, an initialization voltage wire VIL, a first voltage wire VDL, a second voltage wire VSL, and the like. Although not shown in the drawing, other wires may be further provided in the display device 10.

The scan line SCL and the sensing line SSL may extend in the first direction DR1. The scan line SCL and the sensing line SSL may be connected to the scan driver SDR. The scan driver SDR may include a driving circuit. The scan driver SDR may be arranged on one side of the display area DPA in the first direction DR1, but is not limited thereto. The scan driver SDR may be connected to a signal wire pattern CWL, and at least one end of the signal wire pattern CWL may form a pad WPD_CW in the non-display area NDA to be connected to an external device.

In one or more embodiments, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data wire DTL and the initialization voltage wire VIL may extend in a second direction DR2 intersecting the first direction DR1. The first voltage wire VDL and the second voltage wire VSL are disposed to extend in the first direction DR1 and the second direction DR2. As will be described later, the first voltage wire VDL and the second voltage wire VSL may be formed of conductive layers in which a portion extending in the first direction DR1 and a portion extending in the second direction DR2 are disposed on different layers, and may have a mesh structure over the entire surface of the display area DPA. However, the present disclosure is not limited thereto. Each pixel PX of the display device 10 may be connected to at least one data wire DTL, the initialization voltage wire VIL, the first voltage wire VDL, and the second voltage wire VSL.

The data wire DTL, the initialization voltage wire VIL, the first voltage wire VDL, and the second voltage wire VSL may be electrically connected to at least one wire pad WPD. Each wire pad WPD may be disposed in the non-display area NDA. In one or more embodiments, a wire pad (WPD_DT, hereinafter referred to as "data pad") of the data wire DTL, a wire pad (WPD Vint, hereinafter "initialization voltage pad") of the initialization voltage wire VIL, a wire pad (WPD_VDD, hereinafter "first power pad") of the first voltage wire VDL, and a wire pad (WPD_VSS, hereinafter "second power pad") of the second voltage wire VSL may be disposed in the pad area PDA on one side of the display area DPA in the second direction DR2. The external devices may be mounted on the wire pads WPD. The external devices may be mounted on the wire pads WPD by applying an anisotropic conductive film, ultrasonic bonding or the like.

Each pixel PX or sub-pixel SPXn (n is an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one or more embodiments, in each sub-pixel SPXn of the display device 10, the pixel driving circuit may have a 3T1C structure including three transistors and one capacitor. Hereinafter, the pixel driving circuit of the 3T1C structure will be described as an example, but the present disclosure is not limited thereto, and various other modified pixel PX structures such as a 2T1C structure, a 7T1C structure, and a 6T1C structure may be applied.

FIG. 3 is an equivalent circuit diagram of a sub-pixel according to one or more embodiments.

Referring to FIG. 3, each sub-pixel SPXn of the display device 10 according to one or more embodiments include three transistors T1, T2, and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage wire VSL to which a low potential voltage (hereinafter, a second power voltage) lower than a high potential voltage (hereinafter, a first power voltage) of the first voltage wire VDL is supplied. In addition, the other end of the light emitting diode EL may be connected to the source electrode of the second transistor T2.

The first transistor T1 adjusts a current flowing from the first voltage wire VDL, to which the first power voltage is supplied, to the light emitting diode EL according to the voltage difference between the gate electrode and the source electrode (e.g., gate to source voltage) of the first transistor T1. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage wire VDL to which the first power voltage is applied.

The second transistor T2 is turned on by a scan signal of the scan line SCL to connect the data wire DTL to the gate electrode of the first transistor T1. The gate electrode of the second transistor T2 may be connected to the scan line SCL, the source electrode thereof may be connected to the gate electrode of the first transistor T1, and the drain electrode thereof may be connected to the data wire DTL.

The third transistor T3 is turned on by a sensing signal of the sensing line SSL to connect the initialization voltage wire VIL to one end of the light emitting diode EL. The gate electrode of the third transistor T3 may be connected to the sensing line SSL, the drain electrode thereof may be connected to the initialization voltage wire VIL, and the source electrode thereof may be connected to one end of the light emitting diode EL or to the source electrode of the first transistor T1.

In one or more embodiments, the source electrode and the drain electrode of each of the transistors T1, T2, and T3 are not limited to those described above, and vice versa. Further, each of the transistors T1, T2, and T3 may be formed of a thin film transistor (TFT). In addition, in FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOS-FET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one or more embodiments will be described in detail with further reference to other drawings.

FIG. 4 is a cross-sectional view schematically illustrating one pixel of a display device according to one or more embodiments.

Referring to FIG. 4, the display area DPA of the display device 10 may include first to third emission areas LA1, LA2, and LA3. Each of the first to third emission areas LA1, LA2, and LA3 may be an area in which light generated from the light emitting element 30 of the display device 10 is emitted to the outside of the display device 10.

The display device 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member, and may be made of an insulating material such as polymer resin. For example, the substrate 11 may be a flexible substrate which can be bent, folded and/or rolled. The substrate 11 may include polyimide (PI), but is not limited thereto.

The buffer layer 12 may be disposed on the substrate 11. The buffer layer 12 may be formed of an inorganic layer that is capable of preventing air or moisture infiltration. For example, the buffer layer 12 may include a plurality of inorganic layers laminated alternately.

The transistor layer TFTL may be disposed on the buffer layer 12. In one or more embodiments, the buffer layer 12 may be considered a part of the transistor layer TFTL. The transistor layer TFTL may include the first transistor T1, a first gate insulating layer 13, a first interlayer insulating layer 15, a second interlayer insulating layer 17, and a first planarization layer 19.

The first transistor T1 may be disposed on the buffer layer BF, and may constitute a pixel circuit of each of the plurality of pixels. For example, the first transistor T1 may be a switching transistor or a driving transistor of the pixel circuit. The first transistor T1 may include an active layer ACT, a gate electrode G1, a source electrode SE, and a drain electrode DE. The active layer ACT may include a plurality of conductive regions ACTa and ACTb and a channel region ACTc therebetween.

The light emitting element layer EML may be disposed on the transistor layer TFTL. The light emitting element layer EML may include at least a bank pattern BP, the light emitting element 30, and a bank BNL. In one or more embodiments, the light emitting element layer EML may also include electrodes, connection electrodes, and a plurality of insulating layers. The light emitting element 30 may be disposed on the first transistor T1. The light emitting element 30 may be disposed between the first electrode and the second electrode and may be connected to each of the first connection electrode and the second connection electrode.

A detailed description of the above-described transistor layer TFTL and light emitting element layer EML will be given later.

A second planarization layer 41 may be disposed on the light emitting element layer EML to planarize the top portion of the light emitting element layer EML. The second planarization layer 41 may include an organic material. For example, the second planarization layer 41 may include at least one of acryl resin, epoxy resin, phenolic resin, polyamide resin, or polyimide resin.

The wavelength conversion layer WLCL may include a first capping layer CAP1, a first light blocking member BK1, a first wavelength conversion member WLC1, a second wavelength conversion member WLC2, a light transmission member LTU, a second capping layer CAP2, and a third planarization layer 43.

The first capping layer CAP1 may be disposed on the second planarization layer 41 of the light emitting element layer EML. The first capping layer CAP1 may seal the bottom surfaces of the light transmission member LTU and the first and second wavelength conversion members WLC1 and WLC2. The first capping layer CAP1 may contain an inorganic material. For example, the first capping layer CAP1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first light blocking member BK1 may be disposed in the first to third light blocking areas BA1, BA2, and BA3 on the first capping layer CAP1. The first light blocking member BK1 may overlap the bank BNL in the thickness direction of the substrate 11 or the third direction DR3. The first light blocking member BK1 may block transmission of light. The first light blocking member BK1 may prevent light infiltration and color mixture between the first to third emission areas LA1, LA2, and LA3, which leads to the improvement of color reproducibility. The first light blocking member BK1 may be arranged in the form of a grid surrounding the first to third emission areas LA1, LA2, and LA3 in a plan view.

The first light blocking member BK1 may include an organic light blocking material and a lyophobic component.

Here, the lyophobic component may be formed of fluorine-containing monomer or fluorine-containing polymer and, in detail, may include fluorine-containing aliphatic polycarbonate. For example, the first light blocking member BK1 may be made of a black organic material including the lyophobic component. The first light blocking member BK1 may be formed through a coating and exposure process of an organic light blocking material including the lyophobic component.

By including the lyophobic component, the first light blocking member BK1 may separate the first and second wavelength conversion members WLC1 and WLC2 and the light transmission member LTU into the corresponding emission areas LA. For example, in the case of forming the first and second wavelength conversion members WLC1 and WLC2 and the light transmission member LTU in an inkjet manner, the ink compositions may slide on the top surface of the first light blocking member BK1. In this case, the first light blocking member BK1 containing the lyophobic component may allow the ink composition to slide down to each emission area. Therefore, the first light blocking member BK1 may prevent the ink compositions from being mixed.

The first wavelength conversion member WLC1 may be disposed in the first emission area LA1 on the first capping layer CAP1. The first wavelength conversion member WLC1 may be surrounded by the first light blocking member BK1. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a portion of the transmitted light. For example, the first scatterer SCT1 may contain metal oxide particles such as titanium oxide ($TiO_2$), zirconium oxide ($ZrO_2$), aluminum oxide (AlxOy), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, or a fluorescent substance. The quantum dot may be a particulate material that emits light of a specific color when an electron transitions from a conduction band to a valence band.

For example, the quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include Group IV nanocrystal, Group II-VI compound nanocrystal, Group III-V compound nanocrystal, Group IV-VI nanocrystal, a combination thereof, or the like.

For example, the quantum dot may have a core-shell structure including a core containing the aforementioned nanocrystal and a shell that is around (or surrounding) the core. The shell of the quantum dot may act as a protective layer for maintaining semiconductor characteristics by preventing chemical denaturation of the core and as a charging layer for giving electrophoretic characteristics to the quantum dot. The shell may be formed of a single layer or multiple layers. An interface between the core and the shell may have a concentration gradient in which the concentration of elements present in the shell decreases toward the center. The shell of the quantum dot may be formed of a metallic or nonmetallic oxide, a semiconductor compound, or a combination thereof.

The light emitted from the first wavelength shifter WLS1 may have a full width of half maximum (FWHM) of the emission wavelength spectrum, which is 45 nm or less, 40 nm or less, or 30 nm or less. Thus, the purity and reproducibility of colors displayed by the display device 10 can be further improved. The light emitted by the first wavelength shifter WLS1 may be emitted in various directions regardless of the incidence direction of the incident light. This makes possible to improve lateral visibility of the red color displayed in the first emission area LA1.

A portion of the blue light emitted from the light emitting element layer EML may pass through the first wavelength conversion member WLC1 without being converted to red light by the first wavelength shifter WLS1. As a portion of the blue light emitted from the light emitting element layer EML, the light incident on the first color filter CF1 without being converted by the first wavelength conversion member WLC1 may be blocked by the first color filter CF1. The red light produced by the first wavelength conversion member WLC1 by converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the first capping layer CAP1. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material discussed in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a portion of the transmitted light. For example, the second scatterer SCT2 may be made of the same material as the first scatterer SCT1, or may be made of the material discussed in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength that is different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light. The second wavelength shifter WLS2 may be a quantum dot, a quantum rod, or a fluorescent substance. The second wavelength shifter WLS2 may contain the materials identical in purpose with the materials discussed in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the first capping layer CAP1. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material discussed in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a portion of the transmitted light. For example, the third scatterer SCT3 may be formed of the same material as the first scatterer SCT1 or the second scatterer SCT2, or may be made of the material discussed in association with the first scatterer SCT1 or the second scatterer SCT2. The third scatterer SCT3 may scatter the light in random directions regardless of the incidence direction of the incident light without any substantial change of the peak wavelength of the incident light.

Because the wavelength conversion layer WLCL is disposed directly on the second planarization layer 41 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be easily aligned in the first to third emission areas LA1, LA2, and LA3, respectively, and the thickness of the display device 10 may be relatively reduced.

The second capping layer CAP2 may cover the first and second wavelength conversion members WLC1 and WLC2, the light transmission member LTU, and the first light blocking member BK1. For example, the second capping layer CAP2 may seal the first and second wavelength conversion members WLC1 and WLC2 and the light transmission member LTU to prevent the first and second wavelength conversion members WLC1 and WLC2 and the light transmission member LTU from damage or contamination. The second capping layer CAP2 may be made of the same material as the first capping layer CAP1, or may be made of the material discussed in association with the first capping layer CAP1.

The third planarization layer 43 may be disposed on the second capping layer CAP2 to planarize top portions of the first and second wavelength conversion members WLC1 and WLC2 and the light transmission member LTU. The third planarization layer 43 may include an organic material. For example, the third planarization layer 43 may include at least one of acrylic resin, epoxy resin, phenolic resin, polyamide resin, or polyimide resin.

The color filter layer CFL may include a second light blocking member BK2, first to third color filters CF1, CF2, and CF3, and a passivation layer PRT.

The second light blocking member BK2 may be disposed in the first to third light blocking areas BA1, BA2, and BA3 on the third planarization layer 43 of the wavelength conversion layer WLCL. The second light blocking member BK2 may overlap the first light blocking member BK1 or the bank BNL in the thickness direction of the substrate 11 (e.g., the third direction DR3). The second light blocking member BK2 may block transmission of light. The second light blocking member BK2 may prevent light infiltration and color mixture between the first to third emission areas LA1, LA2, and LA3, which leads to the improvement of color reproducibility. The second light blocking member BK2 may be arranged in the form of a grid surrounding the first to third emission areas LA1, LA2, and LA3 in a plan view.

The first color filter CF1 may be disposed in the first emission area LA1 on the third planarization layer 43. The first color filter CF1 may be surrounded by the second light blocking member BK2. The first color filter CF1 may overlap the first wavelength conversion member WLC1 in the thickness direction of the substrate 11 (e.g., the third direction DR3). The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant. The red colorant may include a red dye or a red pigment.

The second color filter CF2 may be disposed in the second emission area LA2 on the third planarization layer 43. The second color filter CF2 may be surrounded by the second light blocking member BK2. The second color filter CF2 may overlap the second wavelength conversion member WLC2 in the thickness direction of the substrate 11 (e.g., the third direction DR3). The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant. The green colorant may include a green dye or a green pigment.

The third color filter CF3 may be disposed in the third emission area LA3 on the third planarization layer 43. The third color filter CF3 may be surrounded by the second light blocking member BK2. The third color filter CF3 may overlap the light transmission member LTU in the thickness direction of the substrate 11 (e.g., the third direction DR3. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant. The blue colorant may include a blue dye or a blue pigment.

The first to third color filters CF1, CF2, and CF3 may absorb a portion of the light coming from the outside of the display device 10 to reduce the reflected light of the external light. This means that the first to third color filters CF1, CF2, and CF3 can prevent color distortion caused by the reflection of the external light.

Because the first to third color filters CF1, CF2, and CF3 are directly disposed on the third planarization layer 43 of the wavelength conversion layer WLCL, the display device 10 may not require a separate substrate for the first to third color filters CF1, CF2, and CF3. Therefore, the thickness of the display device 10 may be relatively reduced.

The third passivation layer PRT may cover the first to third color filters CF1, CF2, and CF3. The third passivation layer PRT may protect the first to third color filters CF1, CF2, and CF3.

The encapsulation layer TFE may be disposed on the third passivation layer PRT of the color filter layer CFL. The encapsulation layer TFE may cover the top and side surfaces of a display layer. For example, the encapsulation layer TFE may include at least one inorganic layer to prevent permeation of oxygen or moisture. In addition, the encapsulation layer TFE may include at least one organic layer to protect the display device 10 from foreign substances such as dust.

Hereinafter, the transistor layer TFTL and the light emitting element layer EML will be described in detail through the planar and cross-sectional structures of one pixel of the display device according to one or more embodiments.

FIG. 5 is a plan view illustrating one pixel of a display device according to one or more embodiments.

Referring to FIG. 5, each of the plurality of pixels PX may include a plurality of sub-pixels SPXn (n is an integer of 1 to 3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In addition, although FIG. 5 illustrates that the pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. In the emission area EMA, the light emitting element 30 is disposed to emit light of a specific wavelength band. In the non-emission area, the light emitting element 30 is not disposed and light emitted from the light emitting element 30 does not reach, so that no light is emitted. The emission area may include an area in which the light emitting element 30 is disposed, and an area adjacent to the light emitting element 30 to emit light emitted from the light emitting element 30.

Without being limited thereto, the emission area may also include an area in which the light emitted from the light emitting element 30 is reflected or refracted by another member and emitted. The plurality of light emitting elements 30 may be disposed in each sub-pixel SPXn, and the emission area may be formed to include an area where the light emitting elements 30 are disposed and an area adjacent thereto.

In addition, each sub-pixel SPXn may further include a sub-region CBA disposed in the non-emission area. The sub-region CBA may be disposed on one side of the emission area EMA in a second direction DR2. The sub-region CBA may be disposed between the emission areas EMA of the sub-pixels SPXn that are adjacent in the second direction DR2. The plurality of emission areas EMA and sub-regions CBA may be arranged in the display area DPA of the display device 10. For example, the plurality of emission areas EMA and the plurality of sub-regions CBA may each be repeatedly disposed along the first direction DR1 and alternately disposed along the second direction DR2. In addition, the separation distance between the adjacent sub-regions CBA in the first direction DR1 may be smaller than the separation distance between the adjacent emission areas EMA in the first direction DR1. The bank BNL may be disposed between the sub-regions CBA and between the emission areas EMA, and the distance therebetween may vary based on the width of the bank BNL. Although light is not emitted from the sub-region CBA because of no light emitting element 30 disposed therein, a portion of electrodes 21 and 22 provided in each sub-pixel SPXn may be disposed in the sub-region CBA. The electrodes 21 and 22 provided in each sub-pixel SPXn may be disposed separately from each other in the sub-region CBA.

FIG. 6 is a cross-sectional view taken along the lines Q1-Q1', Q2-Q2', and Q3-Q3' of FIG. 5. FIG. 6 illustrates a cross-sectional view crossing both ends of the light emitting element 30 disposed in the first sub-pixel SPX1 of FIG. 5.

Referring to FIG. 6 together with FIG. 5, the display device 10 may include a substrate 11, and a semiconductor layer, a plurality of conductive layers, and a plurality of insulating layers disposed on the substrate 11. The semiconductor layer, the conductive layers, and the insulating layers may each constitute a circuit layer and a light emitting element layer of the display device 10.

A light blocking layer BML may be disposed on the substrate 11. The light blocking layer BML may be disposed to overlap an active layer ACT of a first transistor TR1 of the display device 10 in the third direction DR3. The light blocking layer BML includes a material that blocks light, thereby preventing light from entering the active layer ACT of the first transistor T1. For example, the light blocking layer BML may be formed of an opaque metal material that blocks transmission of light. However, the present disclosure is not limited thereto, and in some cases, the light blocking layer BML may be omitted.

A buffer layer 12 may be entirely disposed on the substrate 11 including the light blocking layer BML. The buffer layer 12 may be formed on the substrate 11 to protect the first transistors T1 of the pixel PX from moisture permeating through the substrate 11 susceptible to moisture permeation, and may perform a surface planarization function. The buffer layer 12 may be formed of a plurality of inorganic layers that are alternately stacked. For example, the buffer layer 12 may be formed of a multilayer in which inorganic layers including at least one of silicon oxide (SiOx), silicon nitride (SiNx) and silicon oxynitride (SiOxNy) are alternately stacked.

The semiconductor layer may be disposed on the buffer layer 12. The semiconductor layer may include the active layer ACT of the first transistor T1. These may be disposed to partially overlap a gate electrode G1 and the like of a first gate conductive layer, which will be described later, in the third direction DR3.

Although only the first transistors T1 of the transistors included in the sub-pixel SPXn of the display device 10 are shown in the drawing, the present disclosure is not limited thereto. The display device 10 may include more transistors. For example, the display device 10 may include two or three transistors for each sub-pixel SPXn by including one or more transistors in addition to the first transistor T1.

The semiconductor layer may include polycrystalline silicon, monocrystalline silicon, oxide semiconductor, and the like. When the semiconductor layer includes the oxide semiconductor, each active layer ACT may include a plurality of conductive regions ACTa and ACTb and a channel region ACTc between them. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO) or the like.

In one or more embodiments, the semiconductor layer may include polycrystalline silicon. The polycrystalline silicon may be formed by crystallizing amorphous silicon. In this case, the conductive regions of the active layer ACT may be regions doped with impurities.

The first gate insulating layer 13 may be disposed on the semiconductor layer (e.g., ACT) and the buffer layer 12. The first gate insulating layer 13 may be disposed on the buffer layer 12 including the semiconductor layer (e.g., ACT). The first gate insulating layer 13 may function as a gate insulating layer of each transistor. The first gate insulating layer 13 may be formed of an inorganic layer including an inorganic material, such as silicon oxide (SiOx), silicon nitride (SiNx) or silicon oxynitride (SiOxNy), or a stacked structure thereof.

The first gate conductive layer may be disposed on the first gate insulating layer 13. The first gate conductive layer may include the gate electrode G1 of the first transistor T1 and a first capacitive electrode CSE1 of a storage capacitor (e.g., Cst of FIG. 3). The gate electrode G1 may be disposed to overlap a channel region ACTc of the active layer ACT in the thickness direction of the substrate 11 (e.g., the third direction DR3). The first capacitive electrode CSE1 may be disposed to overlap a second capacitive electrode CSE2 to be described later in the thickness direction of the substrate 11 (e.g., the third direction DR3). In one or more embodiments, the first capacitive electrode CSE1 may be connected to and integrated with the gate electrode G1. The first capacitive electrode CSE1 is disposed to overlap the second capacitive electrode CSE2 in the thickness direction, and a storage capacitor (e.g., Cst of FIG. 3) may be formed therebetween.

The first gate conductive layer may be formed as a single layer or multiple layers made of any one or more of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A first interlayer insulating layer 15 may be disposed on the first gate conductive layer and the first gate insulating layer 13. The first interlayer insulating layer 15 may function as an insulating layer between the first gate conductive layer and other layers disposed thereon. Further, the first interlayer insulating layer 15 may be arranged to cover the first gate conductive layer to protect the first gate conductive layer. The first interlayer insulating layer 15 may be formed of an inorganic layer including an inorganic material, such as silicon oxide (SiOx), silicon nitride (SiNx) or silicon oxynitride (SiOxNy), or a stacked structure thereof.

A first data conductive layer may be disposed on the first interlayer insulating layer 15. The first data conductive layer may include a first source electrode SE and a first drain electrode DE of the first transistor T1, a data wire DTL, and the second capacitive electrode CSE2.

The first source electrode SE and the first drain electrode DE of the first transistor T1 may be in contact with the doped regions ACTa and ACTb of the active layer ACT, respectively, through contact holes penetrating the first interlayer insulating layer 15 and the first gate insulating layer 13, respectively. Further, the first source electrode SE of the first transistor T1 may be electrically connected to the light blocking layer BML through another contact hole penetrating the first interlayer insulating layer 15, the first gate insulating layer 13, and the buffer layer 12.

The data wire DTL may apply a data signal to another transistor included in the display device 10. In one or more embodiments, the data wire DTL may be connected to a source/drain electrode of another transistor to transfer a signal applied from the data wire DTL.

The second capacitive electrode CSE2 may be disposed to overlap the first capacitive electrode CSE1 in the thickness direction of the substrate 11 (e.g., the third direction DR3). In one or more embodiments, the second capacitive electrode CSE2 may be connected integrally with the first source electrode SE of the first transistor T1.

The first data conductive layer may be formed as a single layer or multiple layers made of any one or more of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A second interlayer insulating layer 17 may be disposed on the first data conductive layer. The second interlayer insulating layer 17 may function as an insulating layer between the first data conductive layer and other layers disposed thereon. In addition, the second interlayer insulating layer 17 may cover the first data conductive layer and the first interlayer insulating layer 15, and function to protect the first data conductive layer. The second interlayer insulating layer 17 may be formed of an inorganic layer including an inorganic material, such as silicon oxide (SiOx), silicon nitride (SiNx) or silicon oxynitride (SiOxNy), or a stacked structure thereof.

The second data conductive layer may be disposed on the second interlayer insulating layer 17. The second data conductive layer may include a first voltage wire VL1, a second voltage wire VL2, and a first conductive pattern CDP. The first voltage wire VL1 may be applied with a high potential voltage (or a first source voltage) supplied to the first transistor T1, and the second voltage wire VL2 may be applied with a low potential voltage (or a second source voltage) supplied to the second electrode 22. Also, during the manufacturing process of the display device 10, the second voltage wire VL2 may be applied with an alignment signal required to align the light emitting element 30 on the electrodes 21 and 22.

The first conductive pattern CDP may be connected to the second capacitive electrode CSE2 (of the storage capacitor Cst) through a contact hole formed in the second interlayer insulating layer 17. The second capacitive electrode CSE2 may be integrated with the first source electrode SE of the first transistor T1, and the first conductive pattern CDP may be electrically connected to the first source electrode SE. The first conductive pattern CDP may also be in contact with the first electrode 21 to be described later, and the first transistor T1 may transfer the first source voltage applied from the first voltage wire VL1 to the first electrode 21 through the first conductive pattern CDP. Although it is illustrated in the drawing that the second data conductive layer includes one second voltage wire VL2 and one first voltage wire VL1, the present disclosure is not limited thereto. The second data conductive layer may include a larger number of first voltage wires VL1 and second voltage wires VL2.

The second data conductive layer may be formed as a single layer or multiple layers made of any one or more of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A first planarization layer 19 may be disposed on the second data conductive layer and the second interlayer insulating layer 17. The first planarization layer 19 may include an organic insulating material, for example, an organic material such as polyimide (PI), to perform a surface planarization function.

A plurality of bank patterns BP, a plurality of electrodes 21 and 22, the light emitting element 30, a plurality of connection electrodes CNE1 and CNE2, and a bank BNL may be disposed on the first planarization layer 19. Further, a plurality of insulating layers PAS1, PAS2, PAS3, and PAS4 may be disposed on the first planarization layer 19.

The plurality of bank patterns BP may be directly disposed on the first planarization layer 19. The plurality of bank patterns BP, which have a shape extending in the second direction DR2 within each sub-pixel SPXn without extending to other sub-pixels SPXn adjacent in the second direction DR2, may be disposed in the emission area EMA. In addition, the plurality of bank patterns BP may be disposed to be spaced from each other along the first direction DR1, and the light emitting element 30 may be disposed therebetween. The plurality of bank patterns BP may be disposed for each sub-pixel SPXn to form a linear pattern in the display area DPA of the display device 10. In the drawing, two bank patterns BP are illustrated, but the present disclosure is not limited thereto. A larger number of bank patterns BP may be disposed depending on the number of the electrodes 21 and 22.

The bank pattern BP may have a structure in which at least a part thereof protrudes from the top surface of the first planarization layer 19 in the third direction DR3. The protruding portion of the bank pattern BP may have an inclined side surface, and the light emitted from the light emitting element 30 may be reflected from the electrodes 21 and 22 disposed on the bank pattern BP to be emitted in an upward direction of the first planarization layer 19 (e.g., an image display direction of the display device 10). The bank pattern BP may provide a region in which the light emitting element 30 is disposed, and may also function as a reflective partition wall that reflects light emitted from the light emitting element 30 upward. The side surface of the bank pattern BP may be inclined in a linear shape, but is not limited thereto, and the outer surface of the bank pattern BP may have a curved semi-circle or semi-ellipse shape. The bank pattern BP may include an organic insulating material such as polyimide (PI), but is not limited thereto.

The plurality of electrodes 21 and 22 may be disposed on the bank pattern BP and the first planarization layer 19. The plurality of electrodes 21 and 22 may include a first electrode 21 and a second electrode 22. The first electrode 21 and the second electrode 22 may extend in the second direction DR2, and may be disposed to be spaced from each other in the first direction DR1.

Each of the first electrode 21 and the second electrode 22 may extend in the second direction DR2 within the sub-pixel SPXn, but may be separated from the other electrodes 21 and 22, of an adjacent subpixel SPXn in the second direction DR2, in the sub-region CBA. For example, the sub-region CBA may be disposed between the emission areas EMA of the sub-pixels SPXn that are adjacent in the second direction DR2, and the first electrode 21 and the second electrode 22 may be separated from the other first electrode 21 and second electrode 22 disposed in the sub-pixel SPXn that is adjacent in the second direction DR2 in the sub-region CBA. However, the present disclosure is not limited thereto, and some of the electrodes 21 and 22 may be arranged to extend beyond the adjacent sub-pixel SPXn in the second direction DR2 without being separated for each sub-pixel SPXn in the sub-region CBA, or only one of the first electrode 21 and the second electrode 22 may be separated.

The first electrode 21 may be electrically connected to the first transistor T1 through a first contact hole CT1, and the second electrode 22 may be electrically connected to the second voltage wire VL2 through a second contact hole CT2. For example, the first electrode 21 may be in contact with the first conductive pattern CDP through the first contact hole CT1 penetrating the first planarization layer 19 in a portion of the bank BNL extending in the first direction DR1. The second electrode 22 may be in contact with the second voltage wire VL2 through the second contact hole CT2 penetrating the first planarization layer 19 in the portion of the bank BNL extending in the first direction DR1. However, the present disclosure is not limited thereto. In one or more embodiments, the first contact hole CT1 and the second contact hole CT2 may be disposed in the emission area EMA surrounded by the bank BNL so as not to overlap the bank BNL.

In the drawing, one first electrode 21 and one second electrode 22 are disposed for each sub-pixel SPXn, but the present disclosure is not limited thereto, and a larger number of the first electrodes 21 and a larger number of the second electrodes 22 may be disposed in the sub-pixel SPXn. In addition, the first electrode 21 and the second electrode 22 disposed in each sub-pixel SPXn may not necessarily have a shape extending in one direction, and the first electrode 21 and the second electrode 22 may be arranged in various structures. For example, the first electrode 21 and the second electrode 22 may have a partially curved or bent shape, and one electrode may be disposed to be around (or surround) the other electrode.

The first electrode 21 and the second electrode 22 may be directly disposed on the bank patterns BP. Each of the first electrode 21 and the second electrode 22 may be formed to have a larger width than that of the bank pattern BP in the first direction DR1. For example, each of the first electrode 21 and the second electrode 22 may be disposed to cover the outer surface of the bank pattern BP. The first electrode 21 and the second electrode 22 may be disposed on the respective side surfaces of the bank pattern BP, and a distance between the first electrode 21 and the second electrode 22 may be smaller than a distance between the bank patterns BP. Further, at least a portion of the first electrode 21 and at least a portion of the second electrode 22 are directly disposed on the first planarization layer 19, so that they may be disposed at the same plane. However, the present disclosure is not limited thereto. In some cases, each of the electrodes 21 and 22 may have a width smaller than that of the bank pattern BP. However, each of the electrodes 21 and 22 may be disposed to cover at least one side surface of the bank pattern BP to reflect light emitted from the light emitting element 30.

Each of the electrodes 21 and 22 may include a conductive material having high reflectivity. For example, each of the electrodes 21 and 22 may include a metal such as silver (Ag), copper (Cu), or aluminum (Al) as a material having high reflectivity, or may be an alloy including aluminum (Al), nickel (Ni), lanthanum (La), and the like. Each of the electrode 21 and 22 may reflect, in the upward direction of each sub-pixel SPXn, light emitted from the light emitting element 30 and traveling to the side surface of the bank pattern BP.

However, the present disclosure is not limited thereto, and each of the electrodes 21 and 22 may further include a transparent conductive material. For example, each of the electrodes 21 and 22 may include a material such as indium tin oxide (ITO), indium zinc oxide (IZO), and indium tin zinc oxide (ITZO). In one or more embodiments, each of the electrodes 21 and 22 may have a structure in which at least one transparent conductive material and at least one metal layer having high reflectivity are stacked, or may be formed as one layer including them. For example, each of the electrodes 21 and 22 may have a stacked structure such as ITO/silver (Ag)/ITO, ITO/Ag/IZO, or ITO/Ag/ITZO/IZO.

The plurality of electrodes 21 and 22 may be electrically connected to the light emitting elements 30 and may be applied with a suitable voltage (e.g., a predetermined voltage) to allow the light emitting elements 30 to emit light. For example, the plurality of electrodes 21 and 22 may be electrically connected to the light emitting elements 30 through the connection electrodes CNE1 and CNE2 to be described later, and the electrical signals applied to the electrodes 21 and 22 may be transferred to the light emitting elements 30 through the connection electrodes CNE1 and CNE2.

One of the first electrode 21 and the second electrode 22 may be electrically connected to an anode electrode of the light emitting element 30, and the other one thereof may be electrically connected to a cathode electrode of the light emitting element 30. However, the present disclosure is not limited thereto, and an opposite case may also be possible.

Further, each of the electrodes 21 and 22 may be used to form an electric field in the sub-pixel SPXn to align the light emitting elements 30 between the electrodes 21 and 22. The light emitting elements 30 may be disposed between the first electrode 21 and the second electrode 22 by an electric field formed on the first electrode 21 and the second electrode 22. The light emitting elements 30 of the display device 10 may be injected onto the electrodes 21 and 22 through an inkjet printing process. When inks including the light emitting elements 30 are injected onto the electrodes 21 and 22, an alignment signal is applied to the electrodes 21 and 22 to generate an electric field between the electrodes 21 and 22. The light emitting elements 30 dispersed in the inks may be aligned on the electrodes 21 and 22 by receiving the dielectrophoretic force by the electric field generated on electrodes 21 and 22.

The first insulating layer PAS1 may be disposed on the first planarization layer 19. The first insulating layer PAS1 may be disposed to cover the bank patterns BP and the first and second electrodes 21 and 22. The first insulating layer PAS1 may protect the first electrode 21 and the second electrode 22 while insulating them from each other. Further, it may be possible to prevent the light emitting element 30 disposed on the first insulating layer PAS1 from being damaged by direct contact with other members.

In one or more embodiments, the first insulating layer PAS1 may include an opening OP partially exposing the first electrode 21 and the second electrode 22. Each opening OP may partially expose a portion of the electrodes 21 and 22 disposed on the top surface of the bank pattern BP. Some of the connection electrodes CNE1 and CNE2 may be in contact with each of the electrodes 21 and 22 exposed through the opening OP.

The first insulating layer PAS1 may be formed to have a step such that a portion of the top surface thereof is recessed between the first electrode 21 and the second electrode 22. For example, as the first insulating layer PAS1 is disposed to cover the first electrode 21 and the second electrode 22, the top surface thereof may be stepped according to the shape of the electrodes 21 and 22 disposed therebelow. However, the present disclosure is not limited thereto.

The bank BNL may be disposed on the first insulating layer PAS1. The bank BNL may include portions extending in the first direction DR1 and the second direction DR2 in a plan view to be arranged in a grid pattern over the entire surface of the display area DPA. The bank BNL may be disposed along the boundaries between the sub-pixels SPXn to delimit the neighboring sub-pixels SPXn.

The bank BNL may also be arranged to be around (or surround) the emission area EMA and the sub-region CBA disposed for each sub-pixel SPXn to delimit them from each other. The first electrode 21 and the second electrode 22 may extend in the second direction DR2 to be disposed across a portion of the bank BNL extending in the first direction DR1. In a portion extending in the second direction DR2 of the bank BNL, a portion disposed between the emission areas EMA may have a larger width than a portion disposed between the sub-regions CBA. Accordingly, the distance between the adjacent sub-regions CBA may be smaller than the distance between the adjacent emission areas EMA.

The bank BNL may be formed to have a height greater than that of the bank pattern BP. The bank BNL may prevent ink from overflowing to adjacent sub-pixels SPXn during the inkjet printing process of the manufacturing process of the display device 10, thereby separating inks in which different light emitting elements 30 are dispersed for the corresponding sub-pixels SPXn such that the inks are not mixed. The bank BNL may include polyimide (PI) similarly to the bank pattern BP, but is not limited thereto.

The light emitting element 30 may be disposed on the first insulating layer PAS1. The plurality of light emitting elements 30 may be disposed to be spaced from each other along the second direction DR2 in which the electrodes 21 and 22 extend, and may be aligned substantially parallel to each other. The light emitting element 30 may have a shape extending in one direction, and the extension direction of the light emitting element 30 may be substantially perpendicular to the extension direction of the electrodes 21 and 22. However, the present disclosure is not limited thereto, and the light emitting element 30 may be disposed obliquely without being perpendicular to the extension direction of the electrodes 21 and 22.

The light emitting elements 30 disposed in each sub-pixel SPXn may include a light emitting layer (i.e., an active layer '36' in FIG. 7) including different materials to emit light of different wavelength bands to the outside. Accordingly, light of the first color, light of the second color, and light of the third color may be emitted from the first sub-pixel SPX1, the second sub-pixel SPX2, and the third sub-pixel SPX3, respectively. However, the present disclosure is not limited thereto, and the sub-pixels SPXn may include the light emitting elements 30 of the same type to emit light of substantially the same color.

Between the bank patterns BP, the light emitting element 30 may have respective ends disposed above the electrodes 21 and 22. The extension length of the light emitting element 30 may be longer than the distance between the first electrode 21 and the second electrode 22, and respective ends of the light emitting element 30 may be disposed above the first electrode 21 and the second electrode 22. For example, the light emitting element 30 may be disposed such that one end is located above the first electrode 21 and the other end is located above the second electrode 22.

The light emitting element 30 may be provided with a plurality of layers disposed in a direction perpendicular to the top surface of the substrate 11 or the first planarization layer 19. The light emitting element 30 may be disposed such that one extension direction is parallel to the top surface of the first planarization layer 19, and the plurality of semiconductor layers included in the light emitting element 30 may be sequentially arranged along a direction parallel to the top surface of the first planarization layer 19. However, the present disclosure is not limited thereto, and when the light emitting element 30 has a different structure, the plurality of semiconductor layers may be disposed in a direction perpendicular to the top surface of the first planarization layer 19.

The ends of the light emitting element 30 may be in contact with respective connection electrodes CNE1 and CNE2. For example, in the light emitting element 30, a portion of semiconductor layers 31 and 32 (see FIG. 7) or an electrode layer 37 (see FIG. 7) may be exposed while an insulating layer 38 (see FIG. 7) may not be formed on the end surface on one extension direction side, and the semiconductor layers 31 and 32 (see FIG. 7) or the electrode layer 37 (see FIG. 7) that are exposed may be in contact with the connection electrodes CNE1 and CNE2. However, the present disclosure is not limited thereto, and at least a partial area of the insulating layer 38 may be removed from the light emitting element 30 to partially expose both end side surfaces of the semiconductor layers 31 and 32 (see FIG. 7). The exposed side surface of the semiconductor layers 31 and 32 (see FIG. 7) may be in contact with the connection electrodes CNE1 and CNE2.

The second insulating layer PAS2 may be partially disposed on the light emitting element 30. For example, the second insulating layer PAS2 may have a width smaller than the length of the light emitting element 30 and may be disposed on the light emitting element 30 to expose both ends of the light emitting element 30 while being around (or surrounding) the light emitting element 30. During the manufacturing process of the display device 10, the second insulating layer PAS2 may be disposed to cover the light emitting element 30, the electrodes 21 and 22, and the first insulating layer PAS1 and then may be partially removed to expose both ends of the light emitting element 30. The second insulating layer PAS2 may be disposed to extend in the second direction DR2 on the first insulating layer PAS1 in a plan view, thereby forming a linear or island-like pattern in each sub-pixel SPXn. The second insulating layer PAS2 may protect the light emitting element 30 while fixing the light emitting element 30 during the manufacturing process of the display device 10.

The plurality of connection electrodes CNE1 and CNE2 and the third insulating layer PAS3 may be arranged on the second insulating layer PAS2.

The plurality of connection electrodes CNE1 and CNE2 may have a shape extending in one direction and may be disposed on each of the electrodes 21 and 22. The connection electrodes CNE1 and CNE2 may include a first connection electrode CNE1 disposed on the first electrode 21 and a second connection electrode CNE2 disposed on the second electrode 22. Each of the connection electrodes CNE1 and CNE2 may be disposed to be spaced or opposite to each other. For example, the first connection electrode CNE1 and the second connection electrode CNE2 may be disposed on the first electrode 21 and the second electrode 22, respectively, so as to be spaced from each other in the first direction DR1. Each of the connection electrodes CNE1 and CNE2 may form a stripe pattern in the emission area EMA of each sub-pixel SPXn.

The plurality of connection electrodes CNE1 and CNE2 may each be in contact with the light emitting element 30. The first connection electrode CNE1 may be in contact with one end of the light emitting element 30, and the second connection electrode CNE2 may be in contact with the other end of the light emitting element 30. The semiconductor layers of the light emitting element 30 may be exposed on both end surfaces of the light emitting element 30 in an extension direction of the light emitting element 30, and each of the connection electrodes CNE1 and CNE2 may be in contact with the respective semiconductor layers of the light emitting element 30 to be electrically connected thereto. One side of each of the connection electrodes CNE1 and CNE2 that is in contact with either end of the light emitting element 30 may be disposed on the second insulating layer PAS2. In addition, the first connection electrode CNE1 may be in contact with the first electrode 21 through the opening OP that exposes a portion of the top surface of the first electrode 21, and the second connection electrode CNE2 may be in contact with the second electrode 22 through the opening OP that exposes a portion of the top surface of the second electrode 22.

Each of the connection electrodes CNE1 and CNE2 may have a width measured in one direction less than a width measured in the one direction of each of the electrodes 21 and 22. The connection electrodes CNE1 and CNE2 may be disposed not only to contact one end and the other end of the light emitting element 30 with the respective electrodes 21 and 22, but also to cover a portion of the top surface of the first electrode 21 and a portion of the top surface of the second electrode 22, respectively. However, the present disclosure is not limited thereto, and the connection electrodes CNE1 and CNE2 may have a width greater than the width of the electrodes 21 and 22 to cover both sides of the electrodes 21 and 22.

The connection electrodes CNE1 and CNE2 may include a transparent conductive material. For example, the transparent conductive material may include ITO, IZO, ITZO, aluminum (Al), or the like. The light emitted from the light emitting element 30 may pass through the connection electrodes CNE1 and CNE2 and travel toward the electrodes 21 and 22. However, the present disclosure is not limited thereto.

In the drawing, two connection electrodes CNE1 and CNE2 are disposed in one sub-pixel SPXn, but the present disclosure is not limited thereto. The number of the connection electrodes CNE1 and CNE2 may vary depending on the number of the electrodes 21 and 22 disposed for each sub-pixel SPXn.

The third insulating layer PAS3 may be disposed to cover the first connection electrode CNE1. The third insulating layer PAS3 may be disposed to cover one side on which the first connection electrode CNE1 is disposed with respect to the second insulating layer PAS2, including the first connection electrode CNE1. For example, the third insulating layer PAS3 may be disposed on the second insulating layer PAS2. The third insulating layer PAS3 may also be disposed to cover the first connection electrode CNE1 and the first insulating layers PAS1 disposed on the first electrode 21. This disposition may be formed by a process of disposing the insulating material layer constituting the third insulating layer PAS3 entirely in the emission area EMA, and then partially removing the insulating material layer to form the second connection electrode CNE2. In the above process, the insulating material layer constituting the third insulating layer PAS3 may be removed together with the insulating material layer constituting the second insulating layer PAS2, and one side of the third insulating layer PAS3 may be aligned with one side of the second insulating layer PAS2. One side of the second connection electrode CNE2 may be disposed on the third insulating layer PAS3 and may be insulated from the first connection electrode CNE1 with the third insulating layer PAS3 interposed therebetween.

A fourth insulating layer PAS4 may be entirely disposed in the display area DPA of the substrate 11. The fourth insulating layer PAS4 may function to protect the members disposed on the substrate 11 against the external environment. However, the fourth insulating layer PAS4 may be omitted.

Each of the first insulating layer PAS1, the second insulating layer PAS2, the third insulating layer PAS3, and the fourth insulating layer PAS4 described above may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide (SiOx), silicon nitride (SiNx), silicon oxynitride (SiOxNy), aluminum oxide (AlxOy), and aluminum nitride (AlN). Alternatively, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like. However, the present disclosure is not limited thereto.

FIG. 7 is a perspective view of a light emitting element according to one or more embodiments.

Referring to FIG. 7, the light emitting element 30 may have a rod or cylindrical shape having a suitable aspect ratio (e.g., a predetermined aspect ratio). The light emitting element 30 may have a size of a nanometer scale (equal to or greater than 1 nm and less than 1 μm) to a micrometer scale (equal to or greater than 1 μm and less than 1 mm). In one or more embodiments, both the diameter and the length of the light emitting element 30 may be on a nanometer scale, or on a micrometer scale. In one or more embodiments, the diameter of the light emitting element 30 may be on a nanometer scale, while the length of the light emitting element 30 may be on a micrometer scale. In one or more embodiments, some of the light emitting elements 30 may have a diameter and/or length on a nanometer scale, while some others of the light emitting elements 30 may have a diameter and/or length on a micrometer scale.

In one or more embodiments, the light emitting element 30 may be an inorganic light emitting diode. For example, the light emitting element 30 may include a semiconductor layer doped with any conductivity type (e.g., p-type or n-type) impurities. The semiconductor layer may emit light of a specific wavelength band by receiving an electrical signal applied from an external power source.

The light emitting element 30 according to one or more embodiments may include a first semiconductor layer 31, the active layer 36, a second semiconductor layer 32, and an electrode layer 37 sequentially stacked in a longitudinal direction. The light emitting element may further include an insulating layer 38 fully or partially covering the outer surfaces (e.g., outer peripheral surfaces) of the first semiconductor layer 31, the second semiconductor layer 32, and the active layer 36.

The first semiconductor layer 31 may be an n-type semiconductor. When the light emitting element 30 emits light of a blue wavelength band, the first semiconductor layer 31 may include a semiconductor material having a chemical formula of AlxGayIn1-x-yN (0≤x≤1, 0≤y≤1, 0≤x+y≤1). For example, it may be any one or more of n-type doped AlGaInN, GaN, AlGaN, InGaN, AlN and InN. The first semiconductor layer 31 may be doped with an n-type dopant, and the n-type dopant may be Si, Se, Ge, Sn, or the like. For example, the first semiconductor layer 31 may be n-GaN doped with n-type Si. The length of the first semiconductor layer 31 may have a range of 1.5 μm to 5 μm, but is not limited thereto.

The second semiconductor layer 32 may be disposed on the light emitting layer 36 (to be described later), which is disposed on the first semiconductor layer 31. The second semiconductor layer 32 may be a p-type semiconductor. When the light emitting element 30 emits light of a blue or green wavelength band, the second semiconductor layer 32 may include a semiconductor material having a chemical formula of AlxGayIn1-x-yN (0≤x≤1, 0≤y≤1, 0≤x+y≤1). For example, it may be any one or more of p-type doped AlGaInN, GaN, AlGaN, InGaN, AlN and InN. The second semiconductor layer 32 may be doped with a p-type dopant, and the p-type dopant may be Mg, Zn, Ca, Ba, or the like. For example, the second semiconductor layer 32 may be p-GaN doped with p-type Mg. The length of the second semiconductor layer 32 may have a range of 0.05 μm to 0.10 μm, but is not limited thereto.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. When the light emitting layer 36 emits light of a blue wavelength band, a material such as AlGaN or AlGaInN may be included. For example, when the light emitting layer 36 has a structure in which quantum layers and well layers are alternately stacked in a multiple quantum well structure, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of 450 nm to 495 nm.

However, the present disclosure is not limited thereto, and the light emitting layer 36 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 36 is not limited to light of a blue wavelength band, but the active layer 36 may also emit light of a red or green wavelength band in some cases. The length of the light emitting layer 36 may have a range of 0.05 μm to 0.10 μm, but is not limited thereto.

In one or more embodiments, light emitted from the light emitting layer 36 may be emitted to both side surfaces as well as the outer surface (e.g., the outer peripheral surface) of the light emitting element 30 in a longitudinal direction. The directionality of light emitted from the light emitting layer 36 is not limited to one direction.

The electrode layer 37 may be disposed on the second semiconductor layer 32 and/or the first semiconductor layer 31. The electrode layer 37 may be disposed on at least one end of the light emitting element 30. The electrode layer 37 may be an ohmic connection electrode. However, the present disclosure is not limited thereto, and it may be a Schottky connection electrode. The light emitting element 30 may include at least one electrode layer 37. Although FIG. 7 illustrates that the light emitting element 30 includes one electrode layer 37, the present disclosure is not limited thereto. In some cases, the light emitting element 30 may include a larger number of electrode layers 37 or may be omitted. The following description of the light emitting element 30 may be equally applied even if the number of electrode layers 37 is different or further includes other structures.

In the display device 10 according to one or more embodiments, when the light emitting element 30 is electrically connected to an electrode or a connection electrode, the electrode layer 37 may reduce the resistance between the light emitting element 30 and the electrode or connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The electrode layer 37 may include the same material or different materials, but is not limited thereto.

The insulating layer 38 may be arranged to be around (or surround) the outer surfaces (e.g., outer peripheral surfaces) of the plurality of semiconductor layers and electrode layers described above. For example, the insulating layer 38 may be disposed to be around (or surround) at least the outer surface (e.g., outer peripheral surface) of the light emitting layer 36, and may extend in one direction in which the light emitting element 30 extends. The insulating layer 38 may function to protect the members. The insulating layer 38 may be formed to be around (or surround) side surfaces of the members to expose both ends of the light emitting element 30 in the longitudinal direction.

Although it is illustrated in the drawing that the insulating layer 38 extends in the longitudinal direction of the light emitting element 30 to cover a region from the first semiconductor layer 31 to the side surface of the electrode layer 37, the present disclosure is not limited thereto. The insulating layer 38 may include the light emitting layer 36 to cover only the outer surfaces (e.g., outer peripheral surfaces) of some semiconductor layers, or may cover only a portion of the outer surface (e.g., outer peripheral surface) of the electrode layer 37 to partially expose the outer surface of each electrode layer 37. Further, in cross-sectional view, the insulating layer 38 may have a top surface, which is rounded in a region adjacent to at least one end of the light emitting element 30.

The thickness of the insulating layer 38 may have a range of 10 nm to 1.0 μm, but is not limited thereto. In one or more embodiments, the thickness of the insulating layer 38 may be around 40 nm.

The insulating layer 38 may include materials having insulating properties, for example, silicon oxide (SiOx), silicon nitride (SiNx), silicon oxynitride (SiOxNy), aluminum nitride (AlN), aluminum oxide (AlxOy), and the like. Accordingly, it is possible to prevent an electrical short circuit that may occur when the light emitting layer 36 is in direct contact with the electrode through which the electrical signal is transmitted to the light emitting element 30. In addition, because the insulating layer 38 may be around (or surround) the outer surface (e.g., outer peripheral surface) of the light emitting layer 36 to protect the outer surface (e.g., outer peripheral surface) of the light emitting element 30, it is possible to prevent degradation in light emission efficiency.

Further, the insulating layer 38 may have an outer surface (e.g., outer peripheral surface) that is surface-treated. The light emitting elements 30 may be injected onto the electrode in a state of being dispersed in ink (e.g., a predetermined ink) to be aligned. Here, the surface of the insulating layer 38 may be treated in a hydrophobic or hydrophilic manner in order to keep the light emitting elements 30 in a dispersed state without aggregation with other light emitting elements 30 adjacent in the ink. For example, the insulating layer 38 may be surface-treated on the outer surface thereof with a material such as stearic acid and 2,3-naphthalene dicarboxylic acid.

The display device 10 according to one or more embodiments described above may include the first voltage wire VDL, the second voltage wire VSL, a first data wire DTL1, a second data wire DTL2, a third data wire DTL3, the initialization voltage wire VIL, and the like that are connected to each pixel PX. Each of these may extend in the non-display area NDA and may be connected to the driving integrated circuit. Among these, the first voltage wire VDL may extend to the first auxiliary wire, and the second voltage wire VSL may extend to the second auxiliary wire.

In the non-display area NDA, the initialization voltage wire VIL and the first to third data wires DTL1, DTL2, and DTL3 may be disposed on the lowermost layer, a first auxiliary wire may be disposed on the lowermost layer, a second auxiliary wire may be disposed on the first auxiliary wire, and an insulating layer is disposed therebetween to overlap each other. In this case, a seam may be generated in the insulating layers due to the height difference between the initialization voltage wire VIL and the first to third data wires DTL1, DTL2, and DTL3, and a short circuit or burning may occur between the first auxiliary wire and the second auxiliary wire formed on the insulating layer.

In addition, the display device 10 may be exposed to static electricity or noise signals that may be applied from the outside, thereby causing a defect in the display device 10.

In the following, a display device capable of preventing a short circuit or burning between wires and reducing static electricity or noise signals that may be applied from the outside is disclosed.

FIG. 8 is a plan view schematically illustrating a display device according to one or more embodiments. FIG. 9 is a plan view schematically showing an area A of FIG. 8. FIG. 10 is a cross-sectional view taken along the lines Q4-Q4' and Q5-Q5' of FIG. 9. FIG. 11 is a plan view schematically showing an area B of FIG. 8.

Referring to FIGS. 8-10, the display device 10 according to one or more embodiments include the non-display area NDA around (or surrounding) the display area DPA, and a plurality of wires and voltage patterns may be disposed in the non-display area NDA.

On one side of the display device 10, for example, on a side extending in the second direction DR2 on the lower side, the first voltage wire VDL, the second voltage wire VSL, the initialization voltage wire VIL, the first data wire DTL1, the second data wire DTL2, and the third data wire DTL3 that extend from the display area DPA to the non-display area NDA, may be disposed. These may be wires extending from the pixels in the display area DPA to the non-display area NDA. The first voltage wire VDL, the second voltage wire VSL, the initialization voltage wire VIL, the first data wire DTL1, the second data wire DTL2, and the third data wire DTL3 may be formed of a first conductive layer, a second conductive layer, or a third conductive layer, respectively on the display area DPA, and may extend to the non-display area NDA.

Driving integrated circuits IC may be disposed in the non-display area NDA. The driving integrated circuits IC may transmit signals applied from the outside to the plurality of wires. The number of driving integrated circuits IC disposed in the non-display area NDA may be variously adjusted according to the resolution of the display device 10.

For example, referring to FIGS. 9 and 10, the initialization voltage wire VIL may extend from the display area DPA to the non-display area NDA, and may be connected to the driving integrated circuit IC. The initialization voltage wire VIL may be formed of a first conductive layer in the display area DPA, and may be formed as one body up to the non-display area NDA.

The first data wire DTL1, the second data wire DTL2, and the third data wire DTL3 may extend from the display area DPA to the non-display area NDA, and may be connected to the driving integrated circuit IC. The first data wire DTL1, the second data wire DTL2, and the third data wire DTL3 may be formed of a first conductive layer in the display area DPA, and may be formed as one body up to the non-display area NDA.

In the display device 10 according to one or more embodiments, a first voltage pattern VDA and a second voltage pattern VSA may be disposed in the non-display area NDA adjacent to the driving integrated circuit IC. The first voltage pattern VDA may be disposed on one side (e.g., near a first end of the IC that extends along the first direction DR1) of the driving integrated circuit IC, and the second voltage pattern VSA may be disposed on the other side (e.g., near a second end of the IC opposite to the first end of the IC and that extends along the first direction DR1) of the driving integrated circuit IC. For example, the first voltage pattern VDA may be disposed on the left side of the driving integrated circuit IC, and the second voltage pattern VSA may be disposed on the right side of the driving integrated circuit IC. The first voltage pattern VDA and the second voltage pattern VSA may not overlap each other in the second direction DR3 and may be disposed to be spaced from each other in the first direction DR1.

One end of the first voltage pattern VDA may be connected to the driving integrated circuit IC. The first voltage pattern VDA may be a wire to which a plurality of first voltage wires VDL extending from the display area DPA are connected. One end of the second voltage pattern VSA may be connected to the driving integrated circuit IC. The second voltage pattern VSA may be a wire to which a plurality of second voltage wires VSL extending from the display area DPA are connected. Each of the first voltage pattern VDA and the second voltage pattern VSA described above may be formed of a third conductive layer, and may be disposed to be spaced from each other in a plan view.

The first voltage wire VDL may extend from the display area DPA to the non-display area NDA, and may be connected to the driving integrated circuit IC. The first voltage wire VDL may be formed of a first conductive layer in the display area DPA and may extend to the non-display area NDA. The first voltage wire VDL may be connected to the driving integrated circuit IC by jumping at the non-display area NDA to the first connection wire VDC to be connected to the first voltage pattern VDA. The first voltage wire VDL may be connected to the first connection wire VDC through a first wire contact hole LCT1 to be connected to the first voltage pattern VDA.

The first voltage wire VDL that is spaced from the second voltage pattern VSA in the second direction DR2, may not extend from the display area DPA to the non-display area NDA and may be disposed so as not to overlap the non-display area NDA in the third direction DR3. However, the first voltage wire VDL may be connected to other first voltage wires VDL in the display area DPA.

The second voltage wire VSL may extend from the display area DPA to the non-display area NDA, and may be connected to the driving integrated circuit IC. The second voltage wire VSL may be formed of a first conductive layer in the display area DPA and may extend to the non-display area NDA. The second voltage wire VSL may be connected to the driving integrated circuit IC by jumping at the non-display area NDA to the second connection wire VSC to be connected to the second voltage pattern VSA. The second voltage wire VSL may be connected to the second voltage pattern VSA in the non-display area NDA. The second voltage wire VSL may be connected to the second connection wire VSC through a second wire contact hole LCT2 to be connected to the second voltage pattern VSA.

The second voltage wire VSL that is spaced from the first voltage pattern VDA in the second direction DR2, may not extend from the display area DPA to the non-display area NDA and may be disposed so as not to overlap the non-display area NDA in the third direction DR3. The second voltage wire VSL may be connected to another second voltage wire VSL in the display area DPA. Accordingly, the second voltage wire VSL that is spaced from the first voltage pattern VDA in the second direction DR2 may be applied with a second voltage through the second connection wire VSC that is connected to the second voltage pattern VSA. In addition, the first voltage wire VDL that is spaced from the second voltage pattern VSA in the second direction DR2 may be connected to another first voltage wire VDL in the display area DPA. Accordingly, the first voltage wire VDL that is spaced from the second voltage pattern VSA in the second direction DR2 may be applied with a first voltage through the first connection wire VDC connected to the first voltage pattern VDA.

Referring to FIG. 10 in conjunction with FIG. 9, a first conductive layer may be disposed on the first substrate SUB. The first conductive layer may include the initialization voltage wire VIL, the first data wire DTL1, the second data wire DTL2, the third data wire DTL3, the first voltage wire VDL, and the second voltage wire VSL.

The buffer layer BF, a first gate insulating layer GI, and a first interlayer insulating layer IL1 may be sequentially disposed on the initialization voltage wire VIL, the first data wire DTL1, the second data wire DTL2, the third data wire DTL3, the first voltage wire VDL, and the second voltage wire VSL.

The first voltage pattern VDA and the second voltage pattern VSA may be disposed on the first interlayer insulating layer IL1. For example, the first voltage pattern VDA may be disposed to overlap the initialization voltage wire VIL, the first data wire DTL1, the second data wire DTL2, and the third data wire DTL3 in the third direction DR3. The second voltage pattern VSA may be disposed to overlap the initialization voltage wire VIL, the first data wire DTL1, the second data wire DTL2, and the third data wire DTL3.

The first voltage wire VDL may be connected to the first connection wire VDC through the first wire contact hole LCT1 that penetrates the buffer layer BF, the first gate insulating layer GI, and the first interlayer insulating layer IL1 to expose the first voltage wire VDL, so that a connection may be made to the first voltage wire VDL. The second voltage wire VSL may be connected to the second connection wire VSC through the second wire contact hole LCT2 that penetrates the buffer layer BF, the first gate insulating layer GI, and the first interlayer insulating layer IL1 to expose the second voltage wire VSL, so that a connection may be made to the second voltage wire VSL.

A second interlayer insulating layer IL2 may be disposed on the first voltage pattern VDA and the second voltage pattern VSA.

In one or more embodiments described above, in the non-display area NDA, the initialization voltage wire VIL, the first data wire DTL1, the second data wire DTL2, and the third data wire DTL3 that are formed of a first conductive layer are formed, and the first voltage pattern VDA and the second voltage pattern VSA that are formed of a third conductive layer are formed. That is, by not disposing any conductive layer between the first conductive layer and the third conductive layer in the non-display area, it is possible to prevent a short circuit between the conductive layers stacked thereon due to the step caused by the first conductive layer.

On the other hand, referring to FIGS. 8 and 11, in the display device 10, a plurality of voltage patterns VDA and VSA may be disposed in the non-display area NDA around (or surrounding) the display area DPA. A plurality of first voltage patterns VDA and a plurality of second voltage patterns VSA may be disposed alternately with each other on a first side LS1 of the non-display area NDA of the display device 10, for example, on the lower side of the display area DPA. For example, the first voltage pattern VDA and the second voltage pattern VSA may be alternately disposed along the first direction DR1 on the first side LS1 of the non-display area NDA.

A plurality of first sub-voltage patterns SVDA and a plurality of second sub-voltage patterns SVSA may be alternately disposed with each other on a second side LS2 of the non-display area NDA of the display device 10, which faces (or is opposite) the first side LS1, for example, on the upper side of the display area DPA. For example, the first sub-voltage pattern SVDA and the second sub-voltage pattern SVSA may be alternately disposed along the first direction DR1 on the second side LS2 of the non-display area NDA.

In one or more embodiments, the first voltage pattern VDA may be disposed at one end of the first side LS1 of the non-display area NDA, and the second voltage pattern VSA may be disposed at the other end of the non-display area NDA. The first sub-voltage pattern SVDA may be disposed at one end of the second side LS2 of the non-display area NDA, and the second sub-voltage pattern SVSA may be disposed at the other end of the non-display area NDA.

The plurality of first voltage wires VDL may be disposed between the first voltage pattern VDA and the first sub-voltage pattern SVDA, and may be connected to the first voltage pattern VDA and the first sub-voltage pattern SVDA. That is, the plurality of first voltage wires VDL may extend from the first voltage pattern VDA in the second direction DR2, pass through the display area DPA, and extend to the first sub-voltage pattern SVDA. The plurality of second voltage wires VSL may be disposed between the second voltage pattern VSA and the second sub-voltage pattern SVSA, and may be connected to the second voltage pattern VSA and the second sub-voltage pattern SVSA. That is, the plurality of second voltage wires VSL may extend from the second voltage pattern VSA in the second direction DR2, pass through the display area DPA, and extend to the second sub-voltage pattern SVSA.

A first voltage extension wire VDE and a second voltage extension wire VSE may be disposed in the non-display area NDA of the display device 10. The first voltage extension wire VDE may cross the first side LS1 or the second side LS2 of the non-display area NDA, and may extend along a third side LS3 extending in the second direction DR2, for example, along the left side of the display area DPA. The second voltage extension wire VSE may extend along a fourth side LS4 facing (or opposite) the third side LS3 of the non-display area NDA, for example, along the right side of the display area DPA.

The first voltage extension wire VDE may connect the first voltage pattern VDA disposed on the first side LS1 of the non-display area NDA to the first sub-voltage pattern SVDA disposed on the second side LS2. The first voltage extension wire VDE may extend in a direction opposite to the first direction DR1 from the first voltage pattern VDA, bend in the second direction DR2, and extend along the third side LS3. The first voltage extension wire VDE extending along the third side LS3 may be bent in the first direction DR1 to be connected to the first sub-voltage pattern SVDA disposed on the second side LS2. The first voltage pattern VDA, the first sub-voltage pattern SVDA, and the first voltage extension wire VDE may be formed of a third conductive layer, and may be continuously connected to each other to form one body.

The second voltage extension wire VSE may connect the second voltage pattern VSA disposed on the first side LS1 of the non-display area NDA to the second sub-voltage pattern SVSA disposed on the second side LS2. The second voltage extension wire VSE may extend from the second voltage pattern VSA in the first direction DR1, bend in the second direction DR2, and extend along the fourth side LS4. The second voltage extension wire VSE extending along the fourth side LS4 may be bent in a direction opposite to the first direction DR1 to be connected to the second sub-voltage pattern SVSA disposed on the second side LS2. The second voltage pattern VSA, the second sub-voltage pattern SVSA, and the second voltage extension wire VSE may be formed of a third conductive layer, and may be continuously connected to each other to form one body. The first voltage extension wire VDE and the second voltage extension wire VSE may be formed of the same material.

In one or more embodiments, the plurality of first voltage patterns VDA, the plurality of second voltage patterns VSA, a plurality of first sub-voltage patterns SVDA, a plurality of second sub-voltage patterns SVSA, the first voltage extension wire VDE, and the second voltage extension wire VSE may be disposed to be around (or surround) the display area DPA.

The first voltage pattern VDA and the second voltage pattern VSA may be spaced from each other and alternately arranged along the first side LS1 of the non-display area NDA (e.g., alternately arranged along the first direction DR1) to connect to a plurality of driving integrated circuits IC. A DC voltage is applied to each of the plurality of first voltage patterns VDA and the plurality of second voltage patterns VSA that are alternately disposed, so that static electricity or noise signals that may be applied from the outside on the first side LS1 of the non-display area NDA, may be blocked or reduced.

A plurality of first sub-voltage patterns SVDA and a plurality of second sub-voltage patterns SVSA may be spaced from each other and alternately arranged along the second side LS2 of the non-display area NDA. An alignment signal for alignment of the light emitting element 30 described above may be applied to the second side LS2 of the non-display area NDA. Among these alignment signals, the first alignment signal may be applied to the first voltage wire VDL through the plurality of first sub-voltage patterns SVDA, and the second alignment signal may be applied to the second voltage wire VSL through the plurality of second sub-voltage patterns SVSA. That is, by disposing the plurality of first sub-voltage patterns SVDA and the plurality of second sub-voltage patterns SVSA apart from each other, the first alignment signal and the second alignment signal may be applied. In addition, because the plurality of first sub-voltage patterns SVDA are connected to the first voltage wire VDL and the plurality of second sub-voltage patterns SVSA are connected to the second voltage wire VSL, a DC voltage may be applied. Accordingly, static electricity or noise signals that may be applied from the outside on the second side LS2 of the non-display area NDA may be blocked or reduced.

The first voltage extension wire VDE may be disposed on the third side LS3 of the non-display area NDA, and the second voltage extension wire VSE may be disposed on the fourth side LS4 of the non-display area NDA. The first voltage extension wire VDE may extend along the third side LS3 and is applied with a DC voltage through the first voltage pattern VDA or the first sub-voltage pattern SVDA, and thus static electricity or noise signals that may be applied to the third side LS3 from the outside may be blocked or reduced. The second voltage extension wire VSE may extend along the fourth side LS4 and is applied with a DC voltage through the second voltage pattern VSA or the second sub-voltage pattern SVSA, and thus static electricity or noise signals that may be applied to the fourth side LS4 from the outside may be blocked or reduced.

The display device 10 according to one or more embodiments includes the plurality of first voltage patterns VDA, the plurality of second voltage patterns VSA, the plurality of first sub-voltage patterns SVDA, the plurality of second sub-voltage patterns SVSA, the first voltage extension wire VDE, and the second voltage extension wire VSE. The plurality of first voltage patterns VDA and the plurality of second voltage patterns VSA are arranged along the first side LS1. The plurality of first sub-voltage patterns SVDA and the plurality of second sub-voltage patterns SVSA are arranged along the second side LS2. In addition, the first voltage extension wire VDE extends along the third side LS3 in the second direction DR2 and the second voltage extension wire VSE extends along the fourth side LS4 in the second direction DR2. Therefore, the static electricity or noise signals that may be applied from the outside of the display device 10 may be blocked or reduced.

On the other hand, in the embodiment of FIG. 8 described above, it is described that the first voltage extension wire VDE is disposed on the third side LS3 and the second voltage extension wire VSE is disposed on the fourth side LS4. However, the present disclosure is not limited thereto, and the first voltage extension wires VDE or second voltage extension wires VSE may be disposed on each of the third side LS3 and the fourth side LS3. Hereinafter, other embodiments will be described with reference to other drawings.

FIG. 12 is a plan view schematically illustrating a display device according to one or more embodiments. FIG. 13 is a plan view schematically illustrating a display device according to one or more embodiments.

Referring to FIG. 12, the present embodiment is different from the embodiment of FIGS. 8 and 11 in that the first voltage pattern VDA is disposed at one end and the other end of the first side LS1 of the non-display area NDA, the first sub-voltage pattern SVDA is disposed at one end and the other end of the second side LS2, and the first voltage extension wire VDE extends along the third side LS3 and the fourth side LS4. Hereinafter, descriptions of the same configuration will be omitted, and different configurations will be described.

According to one or more embodiments, the first voltage pattern VDA may be disposed at each of one end and the other end of the first side LS1 of the non-display area NDA. Although the first voltage pattern VDA and the second voltage pattern VSA are alternately arranged along the first side LS1, the order of alternation may be changed in the center of the first side LS1. For example, the first voltage pattern VDA and then the second voltage pattern VSA (in this order) may be alternately arranged along a portion (for example, the left portion) of the first side LS1, and the alternation order may be changed such that the second voltage pattern VSA and then the first voltage pattern VDA (in this order) may be alternately arranged along a portion (for example, the right portion) of the first side LS1. Accordingly, the first voltage pattern VDA may be disposed at one end of the first side LS1, for example, the left edge, and the first voltage pattern VDA may also be disposed at the other end of the first side LS1, for example, the right edge.

Similarly, the first sub-voltage pattern SVDA may be disposed at each of one end and the other end of the second side LS2 of the non-display area NDA. The first sub-voltage pattern SVDA and then the second sub-voltage pattern SVSA (in this order) may be alternately arranged along a portion (for example, the left portion) of the second side LS2, and the alternation order may be changed such that the second sub-voltage pattern SVSA and then the first sub-voltage pattern SVDA (in this order) may be alternately arranged along a portion (for example, the right portion) of the second side LS2. Accordingly, the first sub-voltage pattern SVDA may be disposed at one end of the second side LS2, for example, the left edge, and the first sub-voltage pattern SVDA may also be disposed at the other end of the second side LS2, for example, the right edge.

The first voltage extension wire VDE may extend along each of the third side LS3 and the fourth side LS4 of the non-display area NDA. The first voltage extension wire VDE extending along the third side LS3 may connect the first voltage pattern VDA disposed at one end of the first side LS1 to the first sub-voltage pattern SVDA disposed at one end of the second side LS2. The first voltage extension wire VDE extending along the fourth side LS4 may connect the first voltage pattern VDA disposed at the other end of the first side LS1 to the first sub-voltage pattern SVDA disposed at the other end of the second side LS2.

The display device 10 according to one or more embodiments may include the first voltage extension wires VDE extending along the third side LS3 and the fourth side LS4 of the non-display area NDA, and thus static electricity or noise signals that may be applied from the outside of the display device 10 may be blocked or reduced.

On the other hand, referring to FIG. 13, the display device 10 according to one or more embodiments may also include the second voltage extension wires VSE extending along the third side LS3 and the fourth side LS4 of the non-display area NDA.

The second voltage pattern VSA may be disposed at each of one end and the other end of the first side LS1 of the non-display area NDA. The second voltage pattern VSA and the first voltage pattern VDA may be alternately arranged along the first side LS1, and the alternation order may be changed at the center of the first side LS1. For example, the second voltage pattern VSA and then the first voltage pattern VDA (in this order) may be alternately arranged along a portion (for example, a left portion) of the first side LS1, and the alternation order may be changed such that the first voltage pattern VDA and then the second voltage pattern VSA (in this order) may be alternately arranged along a portion (e.g., a right portion) of the first side LS1. Accordingly, the second voltage pattern VSA may be disposed at one end of the first side LS1, for example, the left edge, and the second voltage pattern VSA may also be disposed at the other end of the first side LS1, for example, the right edge.

Similarly, the second sub-voltage pattern SVSA may be disposed at each of one end and the other end of the second side LS2 of the non-display area NDA. The second sub-voltage pattern SVSA and then the first sub-voltage pattern SVDA (in this order) may be alternately arranged along a portion (for example, a left portion) the second side LS2, and the alternation order may be changed such that the first sub-voltage pattern SVDA and then the second sub-voltage pattern SVSA (in this order) may be alternately arranged along a portion (for example, a right portion) of the second side LS2. Accordingly, the second sub-voltage pattern SVSA may be disposed at one end of the second side LS2, for example, the left edge, and the second sub-voltage pattern SVSA may also be disposed at the other end of the second side LS2, for example, the right edge.

The second voltage extension wire VSE may extend along each of the third side LS3 and the fourth side LS4 of the non-display area NDA. The second voltage extension wire VSE extending along the third side LS3 may connect the second voltage pattern VSA disposed at one end of the first side LS1 to the second sub-voltage pattern SVSA disposed at one end of the second side LS2. The second voltage extension wire VSE extending along the fourth side LS4 may connect the second voltage pattern VSA disposed at the other end of the first side LS1 to the second sub-voltage pattern SVSA disposed at the other end of the second side LS2.

The display device 10 according to one or more embodiments may include the second voltage extension wires VSE extending along the third side LS3 and the fourth side LS4 of the non-display area NDA, and thus static electricity or noise signals that may be applied from the outside of the display device 10 may be blocked or reduced.

On the other hand, the display device 10 may include an alignment key on at least one corner of the non-display area NDA. The alignment key may be used to align the mask or the like and the substrate during the manufacturing process of the display device 10. No other constituent layers other than the alignment key may be disposed on the alignment key. Hereinafter, the display device 10 according to one or more embodiments including an alignment key will be described with reference to other drawings.

FIG. 14 is a plan view schematically illustrating a display device according to one or more embodiments. FIG. 15 is a plan view schematically showing area C of FIG. 14.

Referring to FIGS. 14 and 15, the display device 10 may include the first voltage extension wire VDE and the second voltage extension wire VSE. The present embodiment is different from the embodiments of FIGS. 8-13 in that the first voltage extension wire VDE is spaced from the first sub-voltage pattern SVDA, and the second voltage extension wire VSE is spaced from the second sub-voltage pattern SVSA. Hereinafter, descriptions of the same configuration will be omitted and different configurations will be described.

The display device 10 may include the first voltage extension wire VDE extending along the third side LS3 and the second voltage extension wire VSE extending along the fourth side LS4, of the non-display area NDA.

The first voltage extension wire VDE may be connected to the first voltage pattern VDA disposed on the first side LS1 and extend. The first voltage extension wire VDE may not be connected to the first sub-voltage pattern SVDA disposed on the second side LS2, and may be disposed to be spaced from the first sub-voltage pattern SVDA. That is, the first voltage extension wire VDE extends along the third side LS3 and extends to the first side LS1, but does not extend to the second side LS2.

The second voltage extension wire VSE may be connected to the second voltage pattern VSA disposed on the first side LS1 and extend. The second voltage extension wire VSE may not be connected to the second sub-voltage pattern SVSA disposed on the second side LS2, and may be disposed to be spaced from the second sub-voltage pattern SVSA. That is, the second voltage extension wire VSE extends along the fourth side LS4 and extends to the first side LS1, but does not extend to the second side LS2.

An alignment key AL may be disposed in an area in which the first voltage extension wire VDE and the first sub-voltage pattern SVDA are spaced from each other, for example, at the corner between the second side LS2 and the third side LS3. In addition, the alignment key AL may be disposed in an area in which the second voltage extension wire VSE and the second sub-voltage pattern SVSA are spaced from each other, for example, at the corner between the second side LS2 and the fourth side LS4.

As described above, the alignment key AL may act as a key for aligning a mask or the like and a substrate during a manufacturing process of the display device 10. When another layer that reflects light such as metal is disposed on the alignment key AL, it is difficult to perform an alignment process, and thus another layer may not be disposed on the alignment key AL.

In one or more embodiments, the first voltage extension wire VDE and the first sub-voltage pattern SVDA may be spaced so that the alignment key AL may be disposed at the corner between the second side LS2 and the third side LS3. In addition, the second voltage extension wire VSE and the second sub-voltage pattern SVSA may be spaced so that the alignment key AL may be disposed at the corner between the second side LS2 and the fourth side LS4.

In this case, the plurality of first voltage patterns VDA and second voltage patterns VSA may be alternately arranged along the first side LS1 of the non-display area NDA, the first voltage extension wire VDE may extend along the third side LS3, and the second voltage extension wire VSE may extend along the fourth side LS4. A DC voltage may be applied to the plurality of first voltage patterns VDA, second voltage patterns VSA, first voltage extension wires VDE, and second voltage extension wires VSE, so that static electricity or noise signals that may be applied from the outside may be blocked or reduced.

In addition, the plurality of first sub-voltage patterns SVDA and the plurality of second sub-voltage patterns SVSA, that are arranged along the second side LS2 of the non-display area NDA, may be spaced from the first voltage extension wire VDE and the second voltage extension wire VSE, but because the plurality of first sub-voltage patterns SVDA may be connected to the first voltage wire VDL, and the plurality of second sub-voltage patterns SVSA may be connected to the second voltage wire VSL, a DC voltage may be applied. Accordingly, static electricity or noise signals that may be applied from the outside on the second side LS2 of the non-display area NDA may be blocked or reduced.

The embodiment of FIGS. 14 and 15 described above illustrates that the first voltage extension wire VDE extending along the third side LS3 and the second voltage extension wire VSE extending along the fourth side LS4, but the present disclosure is not limited thereto, and the first voltage extension wire VDE may extend along each of the third side LS3 and the fourth side LS4 as illustrated in FIG. 12, or the second voltage extension wire VSE may extend along each of the third side LS3 and the fourth side LS4 as illustrated in FIG. 13.

FIG. 16 is a plan view schematically illustrating a display device according to one or more embodiments.

Referring to FIG. 16, the display device 10 may include a plurality of first division patterns VDP and a plurality of second division patterns VSP. The present embodiment is different from the embodiment of FIG. 15 described above in that the first voltage extension wire VDE includes the plurality of first division patterns VDP and the second voltage extension wire VSE includes the plurality of second division patterns VSP. Hereinafter, descriptions of the same configuration will be omitted, and different configurations will be described.

The display device 10 may include the first voltage extension wire VDE extending along the third side LS3 and the second voltage extension wire VSE extending along the fourth side LS4, of the non-display area NDA.

The first voltage extension wire VDE may include the plurality of first division patterns VDP. The plurality of first division patterns VDP may be formed of an island-shaped pattern extending in the third side LS3 and arranged along the second direction DR2. The plurality of first division patterns VDP may be disposed to be spaced without being connected to each of the first voltage pattern VDA disposed on the first side LS1 and the first sub-voltage pattern SVDA disposed on the second side LS2. That is, the plurality of first division patterns VDP do not extend to the first side LS1 and the second side LS2.

The second voltage extension wire VSE may include a plurality of second division patterns VSP. The plurality of second division patterns VSP may be formed of an island-shaped pattern extending in the fourth side LS4 and arranged along the second direction DR2. The plurality of second division patterns VSP may be disposed to be spaced without being connected to each of the second voltage pattern VSA disposed on the first side LS1 and the second sub-voltage pattern SVSA disposed on the second side LS2. That is, the plurality of second division patterns VSP do not extend to the first side LS1 and the second side LS2.

The plurality of first division patterns VDP may be connected to the plurality of first voltage auxiliary wires VDM extending from the display area DPA in the first direction DR1. The plurality of first voltage auxiliary wires VDM may be connected to the plurality of first voltage wires VDL in a mesh shape in the display area DPA. The plurality of second division patterns VSP may be connected to the plurality of second voltage auxiliary wires VSM extending from the display area DPA in the first direction DR1. The plurality of second voltage auxiliary wires VSM may be connected to the plurality of second voltage wires VSL in a mesh shape in the display area DPA.

The plurality of first voltage patterns VDA and second voltage patterns VSA may be alternately arranged along the first side LS1 of the non-display area NDA, and the plurality of first sub-voltage patterns SVDA and second sub-voltage patterns SVSA may be alternately arranged along the second side LS2. A DC voltage may be applied to the plurality of first voltage patterns VDA, second voltage patterns VSA, first sub-voltage patterns SVDA, and second sub-voltage patterns SVSA, so that static electricity or noise signals that may be applied from the outside may be blocked or reduced.

In addition, the plurality of first division patterns VDP and the plurality of second division patterns VSP that are arranged along the third side LS3 and the fourth side LS4, respectively, of the non-display area NDA may be spaced from the first voltage patterns VDA and the second voltage patterns VSA, but because the plurality of first division patterns VDP may be connected to the first voltage auxiliary wire VDM, and the plurality of second division patterns VSP may be connected to the plurality of second voltage auxiliary wires VSM, a DC voltage may be applied. Accordingly, static electricity or noise signals that may be applied from the outside on the third side LS3 and the fourth side LS4 of the non-display area NDA may be blocked or reduced.

In the embodiment of FIG. 16 described above, the plurality of first division patterns VDP is arranged along the third side LS3 and the plurality of second division patterns VSP is arranged along the fourth side LS4, but the present disclosure is not limited thereto, and the plurality of first division patterns VDP may be arranged along each of the third side LS3 and the fourth side LS4, or the plurality of second division pattern VSP may be arranged along each of the third side LS3 and the fourth side LS4.

In concluding the detailed description, those skilled in the art will appreciate that many variations and modifications can be made to the embodiments of the present disclosure without substantially departing from the principles, scope, and spirit of the present disclosure. Therefore, the embodiments of the present disclosure are used in a generic and descriptive sense only and not for purposes of limitation.

What is claimed is:

1. A display device comprising:
   a substrate including a display area and a non-display area;
   a first voltage pattern and a second voltage pattern arranged along a first side of the non-display area, the first voltage pattern and the second voltage pattern being alternately located;
   a first sub-voltage pattern and a second sub-voltage pattern arranged along a second side opposite the first side of the non-display area, the first sub-voltage pattern and the second sub-voltage pattern being alternately located;

a first voltage extension wire extending along a third side crossing the first side of the non-display area, wherein the first voltage extension wire extends in the non-display area and outside of the display area in its entire length from the first voltage pattern to the first sub-voltage pattern; and
   a second voltage extension wire extending along a fourth side opposite the third side of the non-display area, wherein the second voltage extension wire extends in the non-display area and outside of the display area in its entire length from the second voltage pattern to the second sub-voltage pattern.

2. The display device of claim 1, wherein the first voltage pattern opposes the first sub-voltage pattern with the display area interposed therebetween, and the second voltage pattern opposes the second sub-voltage pattern with the display area interposed therebetween.

3. The display device of claim 2, wherein the first voltage extension wire extends from the first voltage pattern and is connected to the first sub-voltage pattern, and the second voltage extension wire extends from the second voltage pattern and is connected to the second sub-voltage pattern.

4. The display device of claim 3, wherein the first voltage extension wire extends to the first side and the second side, and the second voltage extension wire extends to the first side and the second side.

5. The display device of claim 4, wherein the first voltage extension wire is formed integrally with the first voltage pattern and the first sub-voltage pattern, the second voltage extension wire is formed integrally with the second voltage pattern and the second sub-voltage pattern, and the first voltage extension wire and the second voltage extension wire comprise a same material.

6. The display device of claim 2, wherein the first voltage extension wire extends from the first voltage pattern and is spaced from the first sub-voltage pattern, and the second voltage extension wire extends from the second voltage pattern and is spaced from the second sub-voltage pattern.

7. The display device of claim 6, wherein the first voltage extension wire extends to the first side and is spaced from the second side, and the second voltage extension wire extends to the first side and is spaced from the second side.

8. The display device of claim 7, wherein the first voltage extension wire is formed integrally with the first voltage pattern, the second voltage extension wire is formed integrally with the second voltage pattern, and the first voltage extension wire and the second voltage extension wire comprise a same material.

9. The display device of claim 6, further comprising one or more alignment keys located between the first sub-voltage pattern and the first voltage extension wire and between the second sub-voltage pattern and the second voltage extension wire, respectively.

10. The display device of claim 1, wherein the first voltage pattern is located at one end of the first side, the first sub-voltage pattern is located at one end of the second side, the second voltage pattern is located at an other end of the first side, and the second sub-voltage pattern is located at an other end of the second side.

11. The display device of claim 1, further comprising:
   a first voltage wire extending from the first voltage pattern and passing through the display area to be connected to the first sub-voltage pattern; and
   a second voltage wire extending from the second voltage pattern and passing through the display area to be connected to the second sub-voltage pattern.

12. A display device comprising:

a substrate including a display area and a non-display area;

a first voltage pattern and a second voltage pattern arranged along a first side of the non-display area, the first voltage pattern and the second voltage pattern being alternately located;

a first sub-voltage pattern and a second sub-voltage pattern arranged along a second side opposite the first side of the non-display area, the first sub-voltage pattern and the second sub-voltage pattern being alternately located;

a first voltage extension wire including a plurality of first division patterns arranged along a third side crossing the first side of the non-display area and spaced from the first voltage pattern;

a second voltage extension wire including a plurality of second division patterns arranged along a fourth side opposite the third side of the non-display area and spaced from the second voltage pattern, and one or more alignment keys located between the first sub-voltage pattern and the first voltage extension wire and between the second sub-voltage pattern and the second voltage extension wire.

13. The display device of claim 12, wherein each of the plurality of first division patterns and the plurality of second division patterns is an island-shaped pattern.

14. The display device of claim 12, further comprising:

a first voltage wire extending from the first voltage pattern and passing through the display area to be connected to the first sub-voltage pattern; and a second voltage wire extending from the second voltage pattern and passing through the display area to be connected to the second sub-voltage pattern.

15. The display device of claim 14, further comprising:

a first voltage auxiliary wire passing through the display area to be connected to the first voltage wire; and a second voltage auxiliary wire passing through the display area to be connected to the second voltage wire, wherein the plurality of first division patterns are connected to the first voltage auxiliary wire, and the plurality of second division patterns are connected to the second voltage auxiliary wire.

16. An electronic device comprising:

a substrate including a display area and a non-display area;

a first voltage pattern and a second voltage pattern arranged along a first side of the non-display area, the first voltage pattern and the second voltage pattern being alternately located;

a first sub-voltage pattern and a second sub-voltage pattern arranged along a second side opposite the first side of the non-display area, the first sub-voltage pattern and the second sub-voltage pattern being alternately disposed;

a first voltage wire extending from the first voltage pattern and passing through the display area to be connected to the first sub-voltage pattern;

a second voltage wire extending from the second voltage pattern and passing through the display area to be connected to the second sub-voltage pattern; and a plurality of voltage extension wires extending along at least two sides crossing the first side of the non-display area and connected to the first voltage pattern or the second voltage pattern, wherein the plurality of voltage extension wires comprises a first voltage extension wire extending along a third side crossing the first side of the non-display area, wherein the first voltage extension wire extends in the non-display area and outside of the display area in its entire length from the first voltage pattern to the first sub-voltage pattern.

17. The electronic device of claim 16, wherein the first voltage pattern is located at each of one end and an other end of the first side, and the first sub-voltage pattern is located at each of one end and an other end of the second side.

18. The electronic device of claim 17, wherein the first voltage extension wire comprises a plurality of first voltage extension wires extending along the third side and a fourth side crossing the first side and connected to the first voltage pattern or the first voltage pattern and the first sub-voltage pattern.

19. The electronic device of claim 16, wherein the second voltage pattern is located at each of one end and an other end of the first side, and the second sub-voltage pattern is located at each of one end and an other end of the second side.

20. The electronic device of claim 19, wherein the plurality of voltage extension wires further comprises second voltage extension wires extending along a third side and a fourth side crossing the first side and connected to the second voltage pattern or the second voltage pattern and the second sub-voltage pattern.

* * * * *